United States Patent
Fujimura et al.

(10) Patent No.: US 7,754,401 B2
(45) Date of Patent: *Jul. 13, 2010

(54) METHOD FOR MANUFACTURING A SURFACE AND INTEGRATED CIRCUIT USING VARIABLE SHAPED BEAM LITHOGRAPHY

(75) Inventors: Akira Fujimura, Saratoga, CA (US); Lance Glasser, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/473,241

(22) Filed: May 27, 2009

(65) Prior Publication Data

US 2010/0055578 A1    Mar. 4, 2010

Related U.S. Application Data

(63) Continuation-in-part of application No. 12/202,364, filed on Sep. 1, 2008.

(60) Provisional application No. 61/172,659, filed on Apr. 24, 2009.

(51) Int. Cl.
*G03F 9/00* (2006.01)

(52) U.S. Cl. ........................ 430/30; 430/296; 430/942

(58) Field of Classification Search .................. 430/30, 430/296, 942
See application file for complete search history.

(56) References Cited

U.S. PATENT DOCUMENTS

| | | | |
|---|---|---|---|
| 4,712,013 | A | 12/1987 | Nishimura et al. |
| 5,082,762 | A | 1/1992 | Takahashi |
| 5,804,339 | A | 9/1998 | Kim |
| 5,885,747 | A | 3/1999 | Yamasaki et al. |
| 6,049,085 | A | 4/2000 | Ema |
| 6,087,046 | A | 7/2000 | Nakasuji |
| 6,291,119 | B2 | 9/2001 | Choi et al. |
| 6,544,700 | B2 | 4/2003 | Ogino |
| 6,610,989 | B1 | 8/2003 | Takahashi |
| 6,677,089 | B2 | 1/2004 | Ogino et al. |
| 6,982,135 | B2 | 1/2006 | Chang et al. |
| 2007/0196768 | A1 | 8/2007 | Ogino |
| 2008/0116397 | A1 | 5/2008 | Yoshida |
| 2008/0116399 | A1 | 5/2008 | Fujimura |
| 2008/0118852 | A1 | 5/2008 | Mitsuhashi |
| 2008/0128637 | A1 | 6/2008 | Yoshida |

FOREIGN PATENT DOCUMENTS

| | | |
|---|---|---|
| JP | 1992-155337 | 5/1992 |
| JP | 1992155337 | 5/1992 |

OTHER PUBLICATIONS

Bloecker, M. et al., "Metrics to Assess Fracture Quality for Variable Shaped Beam Lithography", Proceedings of SPIE, vol. 6349 (2006), pp. 63490Z-1—63490Z-10, SPIE, P.O. Box 10, Bellingham, WA. 98227, U.S.A.

International Search Report and the Written Opinion of the International Searching Authority, Application No. PCT/US2009/053327, mailed Mar. 2, 2010.

*Primary Examiner*—Christopher G Young
(74) *Attorney, Agent, or Firm*—The Mueller Law Office, P.C.

(57) ABSTRACT

A method is disclosed in which a plurality of variable shaped beam (VSB) shots is used to form a desired pattern on a surface. Shots within the plurality of shots are allowed to overlap each other. Dosages of the shots may also be allowed to vary. The union of the plurality of shots may deviate from the desired pattern. The plurality of shots may be determined such that a pattern on the surface calculated from the plurality of shots is within a predetermined tolerance of the desired pattern. In some embodiments, an optimization technique may be used to minimize shot count. In other embodiments, the plurality of shots may be optionally selected from one or more pre-computed VSB shots or groups of VSB shots. The method of the present disclosure may be used, for example, in the process of manufacturing an integrated circuit by optical lithography using a reticle, or in the process of manufacturing an integrated circuit using direct write.

25 Claims, 21 Drawing Sheets

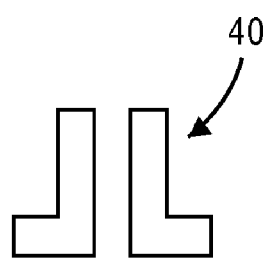 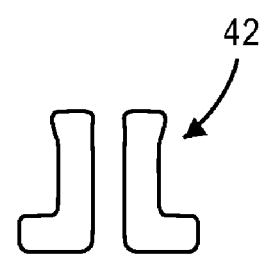 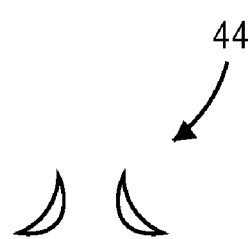
FIG. 3A     FIG. 3B     FIG. 3C
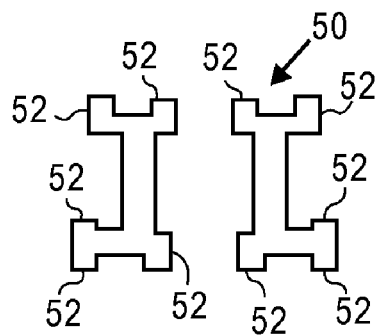 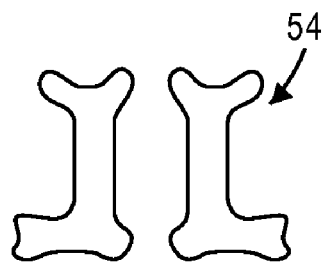 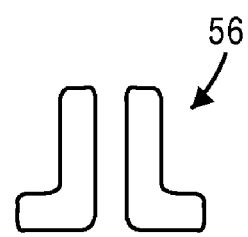
FIG. 4A     FIG. 4B     FIG. 4C

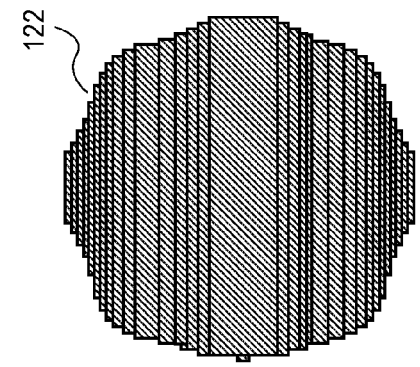
FIG. 10C
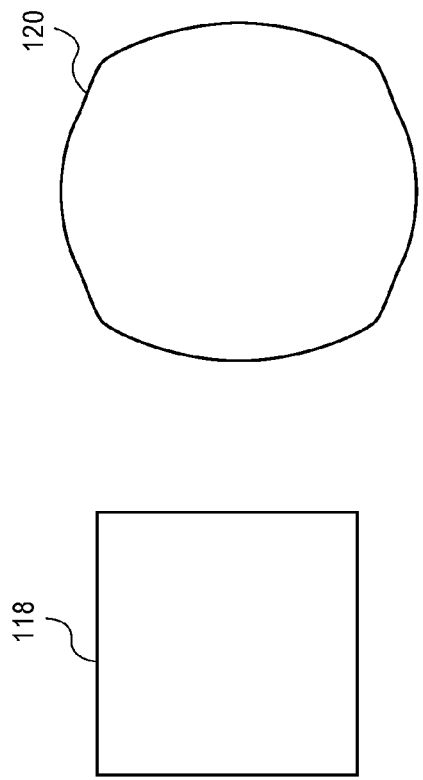
FIG. 10B
FIG. 10A
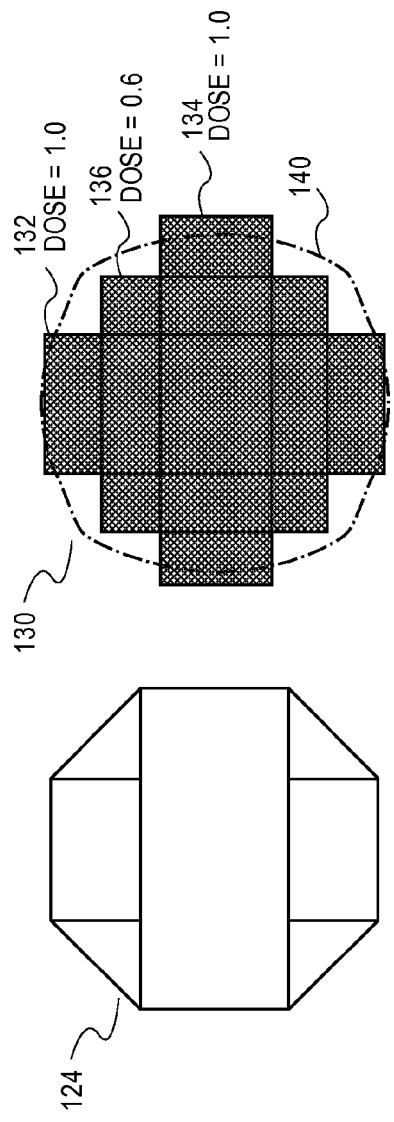
FIG. 10E
FIG. 10D

METHOD FOR MANUFACTURING A SURFACE AND INTEGRATED CIRCUIT USING VARIABLE SHAPED BEAM LITHOGRAPHY

RELATED APPLICATIONS

This application: 1) is a continuation-in-part of U.S. patent application Ser. No. 12/202,364 filed on Sep. 1, 2008 entitled "Method and System for Manufacturing a Reticle Using Character Projection Lithography"; 2) claims priority to U.S. Provisional Patent Application Ser. No. 61/172,659, filed on Apr. 24, 2009 and entitled "Method for Manufacturing a Surface and Integrated Circuit Using Variable Shaped Beam Lithography";3) is related to, U.S. patent application Ser. No. 12/473,248, entitled "Method for Optical Proximity Correction of a Reticle to Be Manufactured Using Variable Shaped Beam Lithography," filed on May 27, 2009; and 4) is related to, U.S. patent application Ser. No. 12/473,265, entitled "Method and System for Design of a Reticle to Be Manufactured Using Variable Shaped Beam Lithography," filed on May 27, 2009; all of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using variable shaped beam (VSB) charged particle beam lithography.

In the production or manufacturing of semiconductor devices, such as integrated circuits, optical lithography may be used to fabricate the semiconductor devices. Optical lithography is a printing process in which a lithographic mask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write or charged particle beam lithography is a printing process in which patterns are transferred to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimensions of its corresponding mask pattern approaches the resolution limit of the optical exposure tool used in optical lithography. As the critical dimensions of the circuit pattern become smaller and approach the resolution value of the exposure tool, the accurate transcription between the mask pattern and the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the original mask pattern to compensate for distortions caused by effects such as optical diffraction and the optical interaction of features with proximate features. OPC includes all resolution enhancement technologies performed with a reticle.

OPC adds sub-resolution lithographic features to mask patterns to reduce differences between the original mask pattern, that is, the design, and the final transferred circuit pattern on the substrate. The sub-resolution lithographic features interact with the original mask pattern and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. As the limits of optical lithography are being extended far into the sub-wavelength regime, the OPC features must be made more and more complex in order to compensate for even more subtle interactions and effects. However, as imaging systems are pushed closer to their limits, the ability to produce reticles with sufficiently fine OPC features becomes critical. Although adding serifs or other OPC features to a mask pattern is advantageous, it also substantially increases the total features count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed.

There are a number of technologies used for forming patterns on a reticle, including using optical lithography or charged particle beam lithography. The most commonly used system is the variable shaped beam (VSB), which is a type of charged particle beam writer system, where a precise electron beam is shaped and steered onto a resist-coated surface of the reticle. These shapes are simple shapes, usually limited to rectangles of certain minimum and maximum sizes and with sides which are parallel to the axes of a Cartesian coordinate plane, and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. The doses or shots of electrons are conventionally designed to avoid overlap wherever possible, so as to greatly simplify calculation of how the resist on the reticle will register the pattern. As OPC features become more complex, however, the division or fracturing of patterns into a set of non-overlapping simple shapes can result in many billions of simple shapes, resulting in very long reticle write times.

It would be advantageous to reduce the time and expense it takes to prepare and manufacture a reticle that is used for manufacturing a substrate. More generally, it would be advantageous to reduce the time and expense it takes to prepare and manufacture any surface. For example, it is possible that a surface can have thousands of patterns that have only slight differences among them. It is desirable to be able to generate all of these slightly different patterns with a minimal number of VSB shots.

SUMMARY OF THE DISCLOSURE

A method is disclosed in which a plurality of variable shaped beam (VSB) shots is used to form a desired pattern on a surface. Shots within the plurality of shots are allowed to overlap each other. Dosages of the shots may also be allowed to vary. The union of the plurality of shots may deviate from the desired pattern. The plurality of shots may be determined such that a pattern on the surface calculated from the plurality of shots is within a predetermined tolerance of the desired pattern. In some embodiments, an optimization technique may be used to minimize shot count. In other embodiments, the plurality of shots may be optionally selected from one or more pre-computed VSB shots or groups of VSB shots, that is, glyphs. The method of the present disclosure may be used, for example, in the process of manufacturing an integrated circuit by optical lithography using a reticle, or in the process of manufacturing an integrated circuit using direct write.

These and other advantages of the present disclosure will become apparent after considering the following detailed specification in conjunction with the accompanying drawings.

BRIEF DESCRIPTION OF THE DRAWINGS

FIG. 3A illustrates a design of a pattern to be placed on a substrate;

FIG. 3B illustrates a pattern formed in a reticle from the design shown in FIG. 3A;

FIG. 3C illustrates a pattern formed in the photoresist of a substrate using the reticle of FIG. 3B;

FIG. 4A illustrates an optical proximity corrected version of the pattern shown in FIG. 3A;

FIG. 4B illustrates an optical proximity corrected version of the pattern shown in FIG. 4A after it is formed in the reticle;

FIG. 4C illustrates a pattern formed in the photoresist of a silicon wafer using the reticle of FIG. 4B;

FIG. 10A illustrates a design of a square pattern;

FIG. 10B illustrates the pattern of FIG. 10A after OPC;

FIG. 10C illustrates a fracturing of the pattern of FIG. 10B into non-overlapping rectangles;

FIG. 10D illustrates a fracturing of the pattern of FIG. 10B into overlapping rectangles;

FIG. 10E illustrates an exemplary plurality of overlapping rectangles according to the present disclosure;

DETAILED DESCRIPTION OF THE EMBODIMENTS

The improvements and advantages of the present disclosure can be accomplished by allowing overlapping VSB shots and other-than-normal dosages, and by allowing the union of the shots to deviate from the target pattern, allowing patterns to be created from a reduced number of shots compared to the more conventional non-overlapping, normal dosage VSB shots. Thus, a method and a system are provided for manufacturing a surface that addresses the prior problem such as lengthy write time and consequent high cost associated with preparing a surface.

Figure 1:
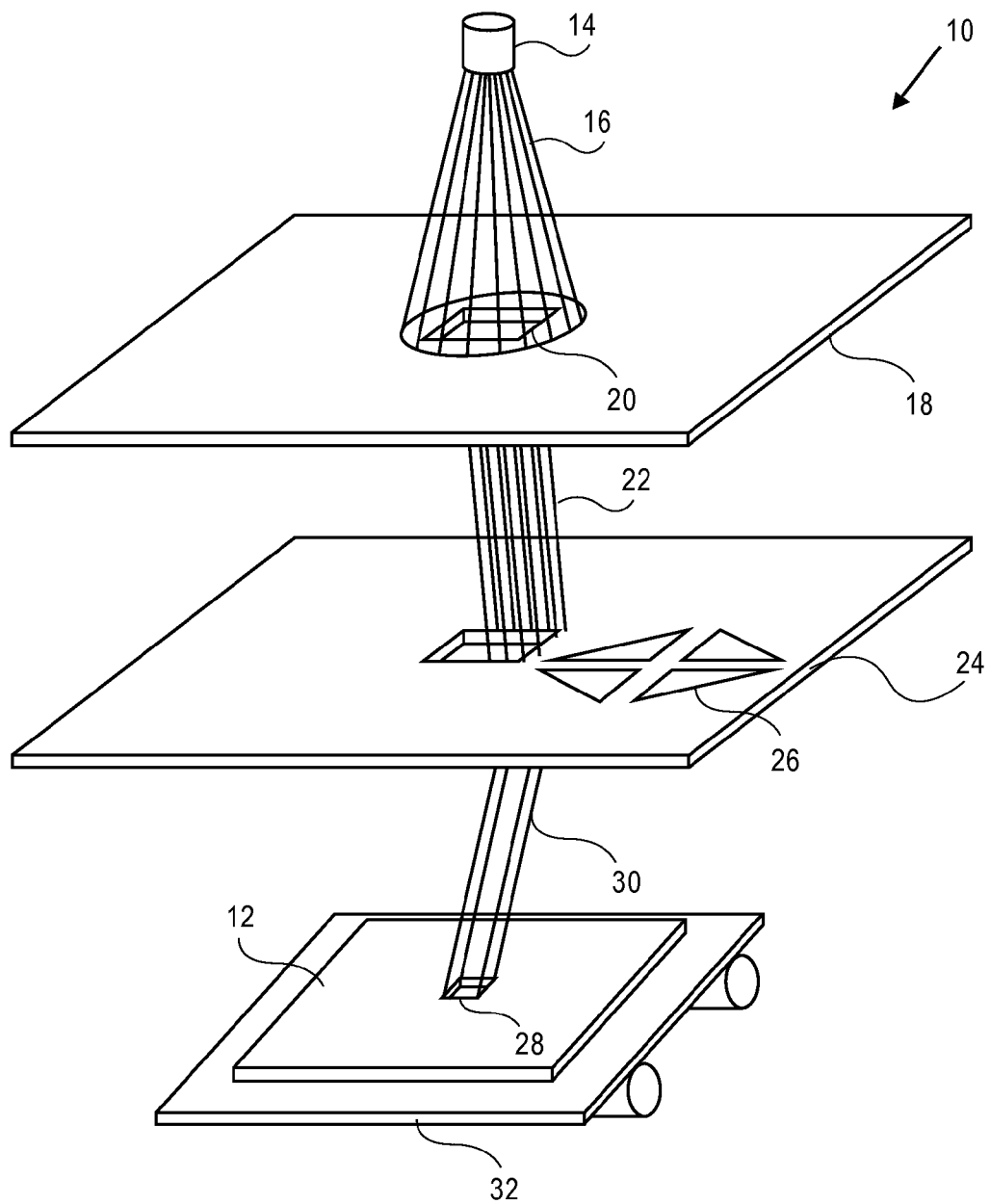
FIG. 1 illustrates a variable shaped beam charged particle beam writer system used to manufacture a surface.
Figure 2:
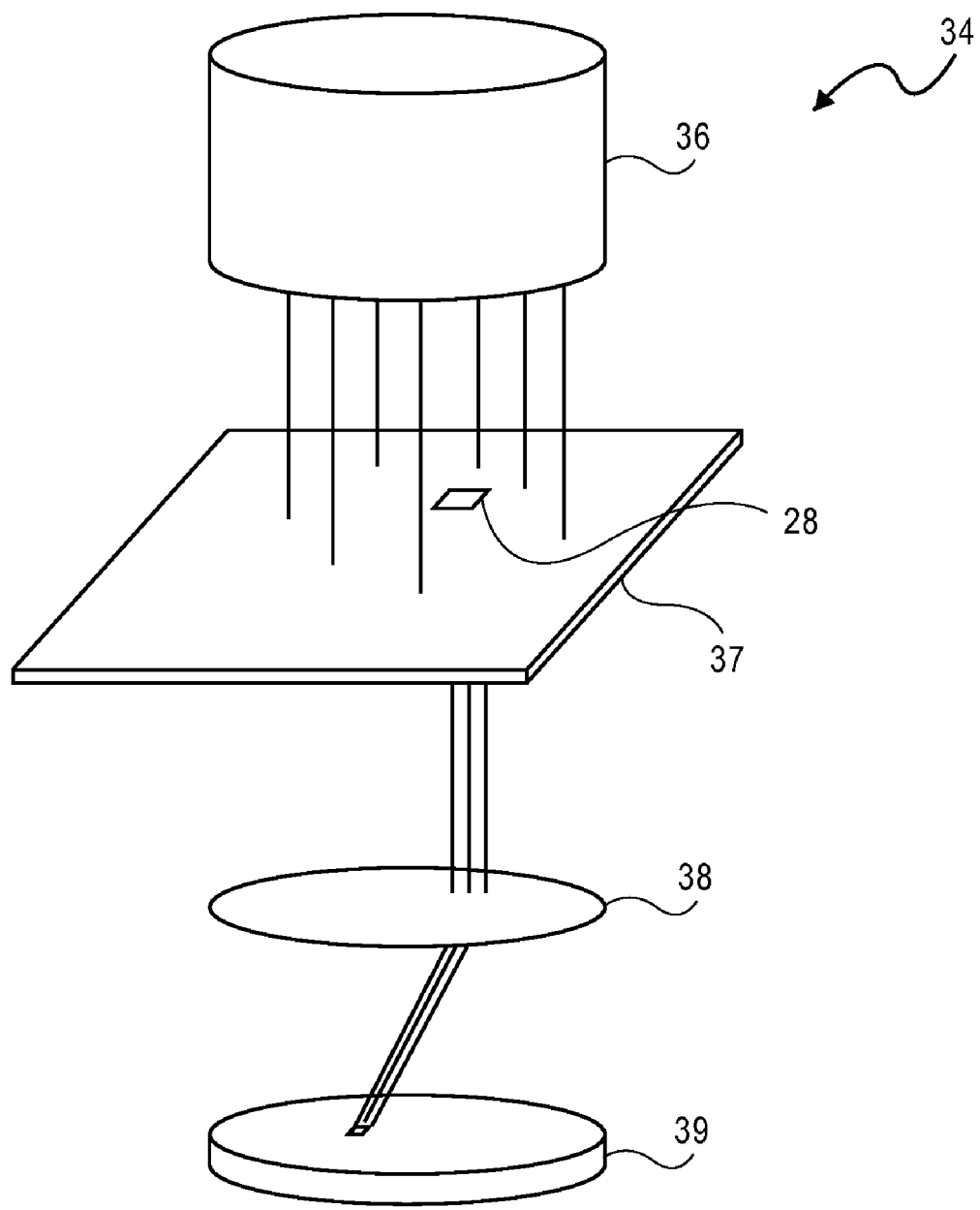
FIG. 2 illustrates an optical lithography system.

Referring now to the drawings, wherein like numbers refer to like items, FIG. 1 identifies an embodiment of a lithography system, such as a charged particle beam writer system, in this case an electron beam writer system 10, that employs a variable shaped beam (VSB) to manufacture a surface 12 according to the present disclosure. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil mask 24 has formed therein a number of apertures 26 that define various simple shapes such as rectangles and triangles. Each aperture 26 formed in the stencil mask 24 may be used to form a pattern in the surface 12. An electron beam 30 emerges from one of the apertures 26 and is directed onto the surface 12 as a pattern 28. The surface 12 is coated with resist (not shown) which reacts with the electron beam 30. The electron beam 22 may be directed to overlap a variable portion of an aperture 26, affecting the size and shape of the pattern 28. The surface 12 is mounted on a movable platform 32. The platform 32 allows surface 12 to be repositioned so that patterns which are larger than the maximum deflection capability or field size of the charged particle beam 30 may be written to surface 12. In one embodiment the surface 12 may be a reticle. In this embodiment, the reticle, after being exposed with the pattern, undergoes various manufacturing steps through which it becomes a lithographic mask. The mask may then be used in an optical lithography device or machine 34, illustrated in FIG. 2. The optical lithography machine 34 comprises an illumination source 36, the mask 37, and one or more lenses 38 which project an image of the reticle pattern 28, generally reduced in size, onto a silicon wafer 39 to produce an integrated circuit. More generally, the mask 37 is used in another device or machine to transfer the pattern 28 on to a substrate 39. In another embodiment the surface 12 is a substrate such as a silicon wafer.

As indicated above, since semiconductor and other nano-technology manufacturers are reaching the limits of optical lithography, it is difficult to transfer an ideal pattern onto a substrate. For example, FIG. 3A illustrates an ideal pattern 40, which represents a circuit, to be formed in the resist of a substrate. When a reticle and mask are produced that attempt to have the pattern 40 formed thereon, the reticle is not a perfect representation of the pattern 40. A pattern 42 that may be formed in a reticle that attempts to represent the pattern 40 is shown in FIG. 3B. The pattern 42 has more rounded and shortened features as compared to the pattern 40. When the pattern 42 is employed in the optical lithography process, a pattern 44 is formed in the photoresist on the substrate as depicted in FIG. 3C. The pattern 44 is not very close to the ideal pattern 40, demonstrating why optical proximity correction is required.

In an effort to compensate for the difference between the patterns 40 and 44, optical proximity correction is used. Optical proximity correction alters the design pattern so as to alter the reticle to compensate for distortions created by optical diffraction, optical interactions with neighboring shapes, and resist process effects. FIGS. 4A-4C show how optical proximity correction can be employed to enhance the optical lithography process to develop a better version of the pattern 44. In particular, FIG. 4A illustrates a pattern 50 that is an altered version of the pattern 40. The pattern 50 has a serif element 52 added to various corners of the pattern 50 to provide extra area in an attempt to reduce optical and processing effects that reduce the sharpness of the corner. When a reticle of the pattern 50 is produced it may appear in the reticle as a pattern 54 as shown in FIG. 4B. When the optical proximity corrected pattern 54 is used in an optical lithography device an output pattern 56, as depicted in FIG. 4C, is produced. The pattern 56 more resembles the ideal pattern 40 than the pattern 44 and this is due to optical proximity correction. Although using optical proximity correction is helpful, it may require that every pattern be altered or decorated which increases the time and cost to produce a reticle. Also, the various patterns formed on the reticle may properly have slight differences between them when OPC is applied and this adds to the time and expense in preparing a reticle.

Figure 5A:
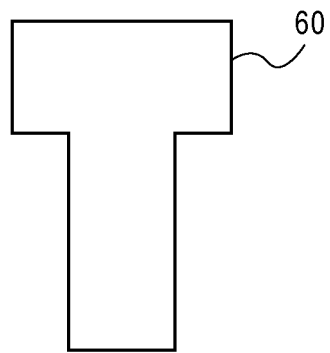
FIG. 5A illustrates a design of a pattern to be formed on a substrate.
Figure 5B:
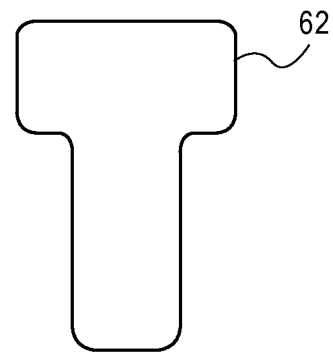
FIG. 5B illustrates the pattern of FIG. 5A formed on a surface using a normal dose.
Figure 5C:
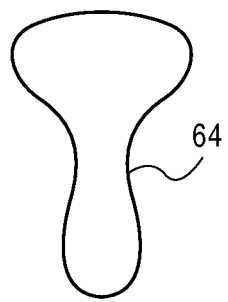
FIG. 5C illustrates the pattern of FIG. 5A formed on a surface using a less than normal dose.
Figure 5D:
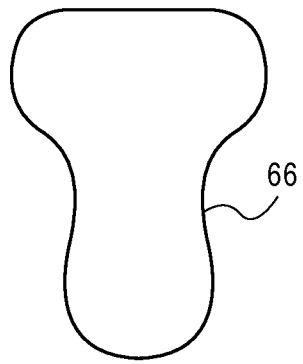
FIG. 5D illustrates the pattern of FIG. 5A formed on a surface using a greater than normal dose.

Referring to FIG. 1, when a pattern is written to a resist-coated surface 12, the resulting pattern on the surface depends on the quantity of particles which reach the resist, called the exposure or dose. A dose of a variable shaped beam shot is the shutter speed, the length of time for which a given shot is being projected on the surface. "Dose correction" is a process step in which the dose amount for any given shot is modified slightly, for example, for proximity effect correction (PEC). Because of this the optimal or "normal" dose will not be the same for all shots. FIG. 5A illustrates a sample polygonal pattern 60 that is to be written on a surface. FIG. 5B illustrates a pattern 62 that will result on the reticle with a normal dose. Note that the corners of pattern 62 are somewhat rounded compared to the ideal pattern 60. FIG. 5C illustrates a pattern 64 that may result on the reticle with a less than normal dose. The pattern 64 is generally thinner and the long ends of the pattern are shortened somewhat compared to normal dose pattern 62. FIG. 5D illustrates a pattern 66 that may result on the reticle with a greater than normal dose. The pattern 66 is "fatter", slightly larger in all dimensions than the normal dose pattern 62. The differences between patterns 62, 64 and 66 are due to the response of the resist to varying doses.

Figures 6A, 6B:
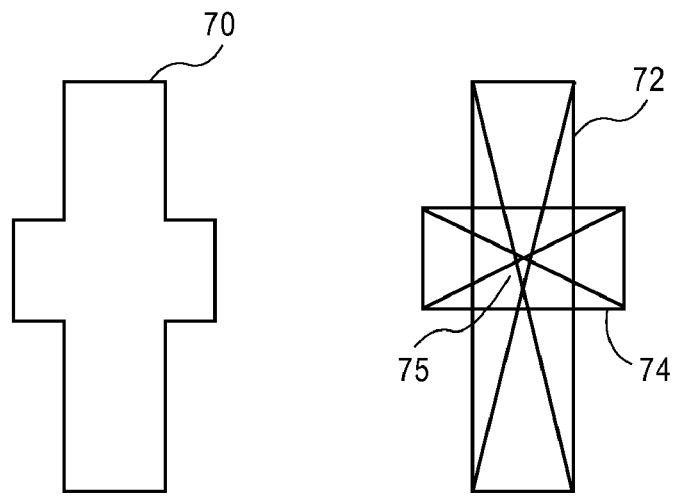
FIG. 6A illustrates a polygonal pattern to be formed on a surface.
FIG. 6B illustrates a fracturing of the pattern of FIG. 6A into overlapping rectangles.
Figures 6C, 6D:
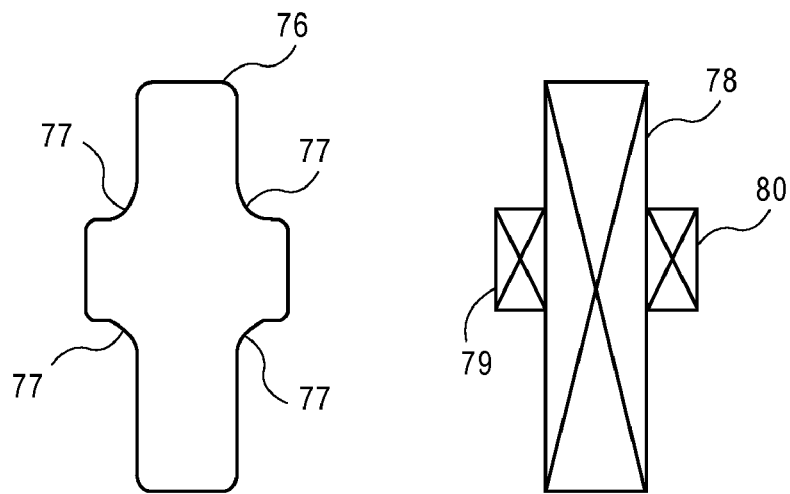
FIG. 6C illustrates the resultant pattern on the surface formed from the overlapping rectangles of FIG. 6B.
FIG. 6D illustrates a fracturing of the pattern of FIG. 6A into non-overlapping rectangles.

VSB shots which overlap will inherently cause dosage variations between the overlapping and non-overlapping areas. For example, FIG. 6A illustrates a design pattern 70 which must be decomposed or fractured into simple shapes for VSB writing. FIG. 6B illustrates one fracturing solution, consisting of two rectangles 72 and 74. Rectangles 72 and 74 are marked with interior "X" patterns for ease of identification. As can be seen, rectangles 72 and 74 overlap in a rectangular region 75. If shape 70 is exposed using rectangles 72 and 74, region 75 will receive a dose that is the sum of the rectangle 72 dose and the rectangle 74 dose. This may cause the exposed pattern to be "fatter" in the vicinity of region 75 than the designed pattern 70. FIG. 6C illustrates a pattern 76 that may be formed on a surface using the fracturing of FIG. 6B. In pattern 76 note that the interior corners 77 are significantly rounded because of the extra exposure in region 75. FIG. 6D illustrates an alternative fracturing of pattern 70 consisting of three rectangles 78, 79 and 80 which do not overlap. The fracturing of FIG. 6D is conventionally preferred because all parts of pattern 70 can receive the normal exposure, which may provide a more faithful transfer of design pattern 70 to the surface than the fracturing of FIG. 6B.

Figure 7A:
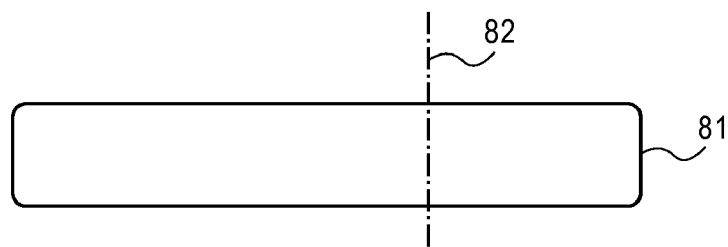
FIG. 7A illustrates a rectangular pattern which extends across a field boundary of a charged particle beam writer system.
Figure 7B:
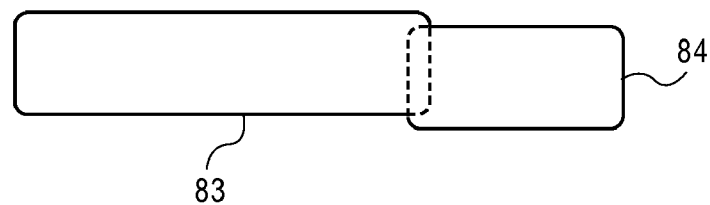
FIG. 7B illustrates a pattern on the surface that may result from writing of the pattern in FIG. 7A due to imprecision in the charged particle beam writer system.
Figure 7C:
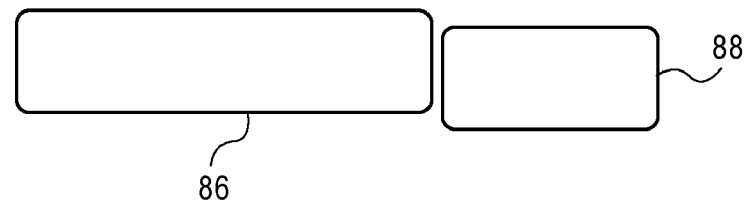
FIG. 7C illustrates another pattern on the surface that may result from writing the pattern of FIG. 7A due to imprecision in the charged particle beam writer system.
Figure 7D:
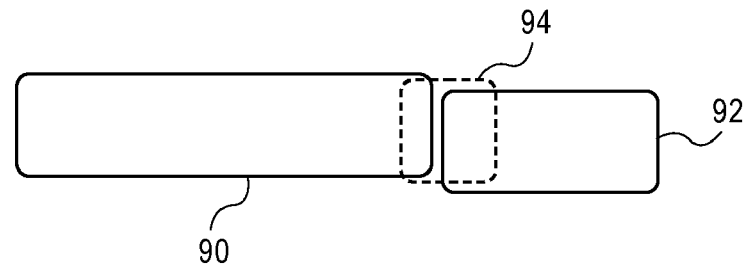
FIG. 7D illustrates a method of transferring the pattern of FIG. 7A to the surface using a ghost shot.

There are certain circumstances in which VSB shots may be conventionally overlapped. For example, if when the pattern is prepared for exposure, a pattern shape is determined to extend beyond the boundary of one field of the FIG. 1 electron beam 30, then the shape must be exposed in multiple steps, where part of the pattern is exposed, the platform 32 is moved, and another part of the pattern is exposed. FIG. 7A illustrates a pattern 81 which, in this example, crosses a field boundary 82. FIG. 7B illustrates one way in which two shots 83 and 84, if shot in different fields, may expose the surface. Due to imprecision in the ability to position the platform 32, shots 83 and 84 are slightly misaligned in both the vertical and horizontal directions. In the FIG. 7B example the misalignment has produced a small area of overlap. If this pattern is eventually transferred to a substrate and manufactured into an integrated circuit, this overlap may commonly cause no problem. FIG. 7C illustrates another possible misalignment. In FIG. 7C the horizontal misalignment between shots 86 and 88 has created a gap between the shots. If this gap is transferred to a substrate such as a silicon wafer, the resulting integrated circuit may not function properly. One method of preventing potential misalignment from causing a circuit malfunction is illustrated in FIG. 7D where a potential gap between shots 90 and 92 is filled in with a small additional shot 94, called a ghost shot. Ghost shots and similar techniques designed to compensate for imprecision in the pattern writing process result in increased shot count.

Figure 8A:
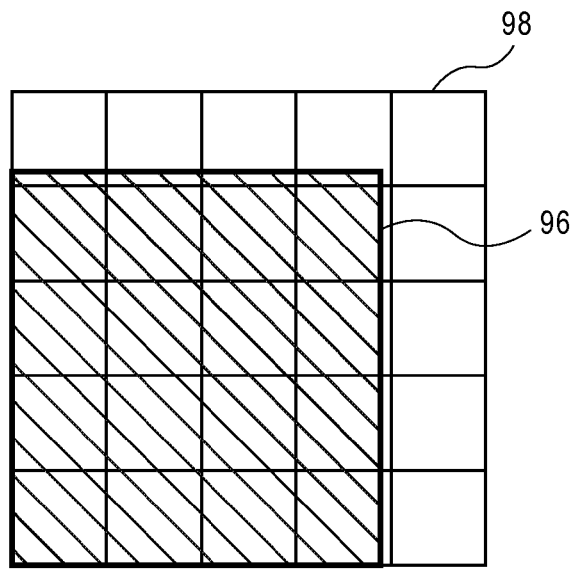
FIG. 8A illustrates one division of a design pattern (hatched) into fields for writing by a charged particle beam writer system.
Figure 8B:
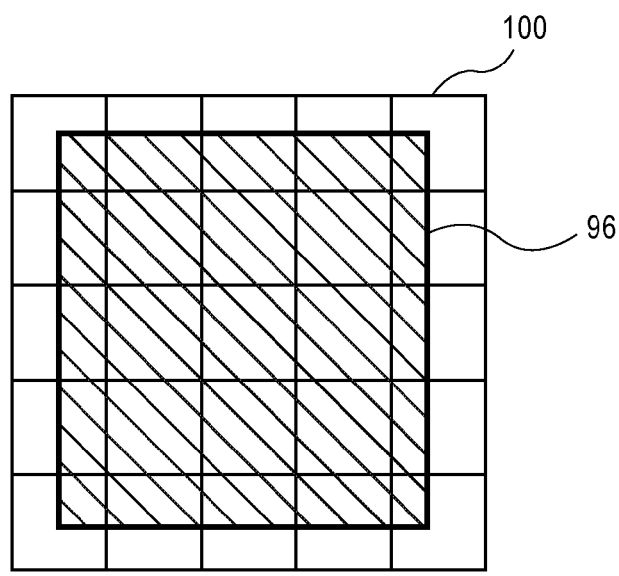
FIG. 8B illustrates another division of a design pattern (hatched) into fields for writing by a charged particle beam writer system.

Multi-pass writing is another conventional technique in which VSB shots are intentionally overlapped. With this technique the entire pattern is exposed once, then the entire pattern is exposed a second time. More than two passes may also be used. Multi-pass writing may be used to reduce non-ideal writing effects such as resist heating, resist charging and field-to-field misalignment. FIGS. 8A-B illustrate how field-to-field misalignment effects can be reduced. FIG. 8A illustrates a design 96, shown as the hatched area, which has been overlaid on a 5×5 field grid 98. As previously described with FIG. 7, shapes which cross a field boundary will be split and exposed in multiple steps. FIG. 8B illustrates the same design 96, shown as the hatched area, overlaid on a 5×5 field grid 100 such that that the alignment of the design 96 with grid 100 is different than with grid 98. If the patterns in the design 96 are fractured for exposure on grid 98 in one pass, and then re-fractured for exposure on grid 100 in a second pass, field-to-field misalignments from the first pass will occur at different locations than field-to-field misalignments from the second pass, thereby reducing the effects of misalignment. In multi-pass writing, the dosage for each pass is proportionately lower than for single-pass writing, the goal being that the sum of the doses for all passes will be a normal dose for all parts of the pattern. Conventionally, therefore, shot overlap within a pass is avoided. Multi-pass exposure may also be used to reduce the effects of other non-ideal writing effects such as resist heating and resist charging. Multiple pass exposure substantially increases shot count.

Figure 16A:
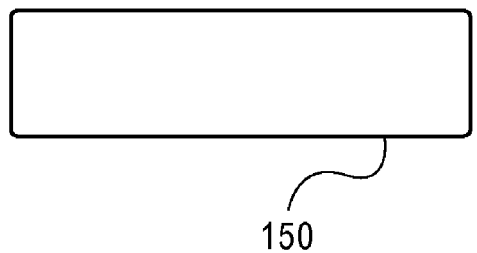
FIG. 16A illustrates a pattern to be formed on a surface.
Figure 16B:
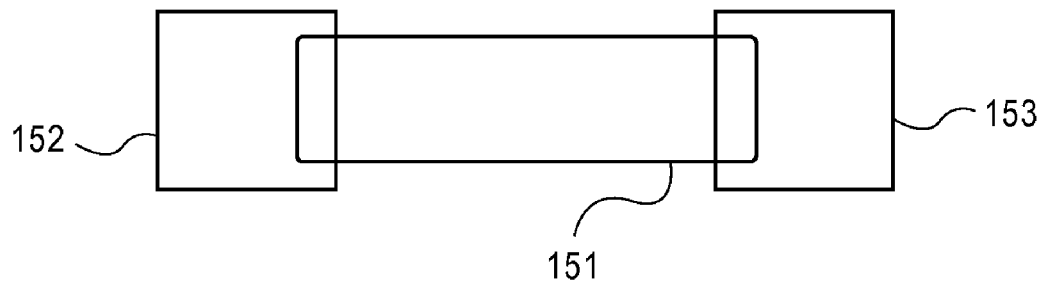
FIG. 16B illustrates use of a main VSB shot and auxiliary VSB shots to form the pattern of FIG. 16A.

FIGS. 16A-B illustrate another known technique. In FIG. 16A, shape 150 is the desired pattern to be formed on the surface. FIG. 16B illustrates a set of three VSB shots that may be used to form the pattern. In this example, shot 151 is the shape of the desired pattern, and shots 152 and 153 are auxiliary shots. Shots 152 and 153 are shot with a lower than normal dose, and are designed to prevent the shortening of the ends of shape 150 during exposure and subsequent resist processing. In the technique of FIGS. 16A-B there is a clear distinction between the shots for the desired pattern and the auxiliary shots.

Figure 17A:
FIG. 17A illustrates a pattern to be formed on a surface.
Figure 17B:
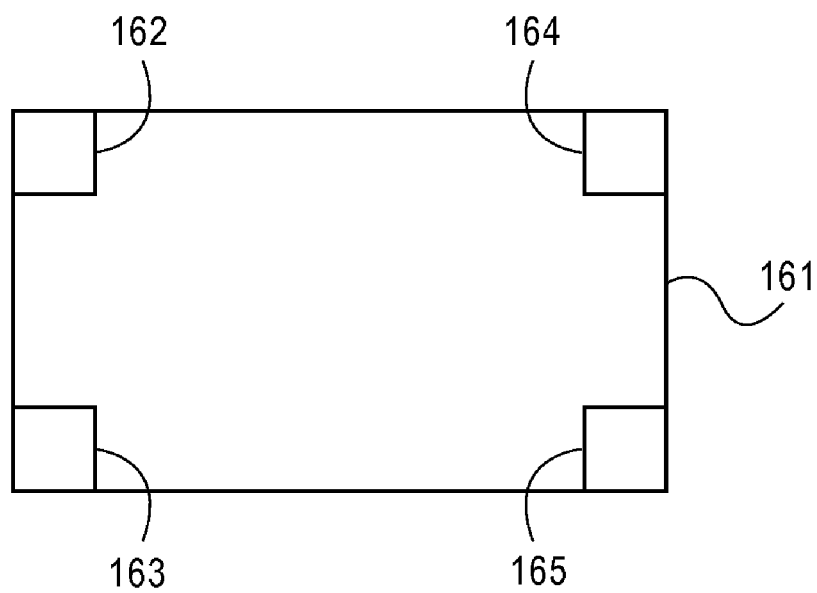
FIG. 17B illustrates use of a main VSB shot and auxiliary VSB shots to form the pattern of FIG. 17A.

FIGS. 17A-B illustrate another known technique. FIG. 17A illustrates a desired pattern 160 to be formed on a surface. FIG. 17B illustrates five VSB shots which may be used to form the pattern. Shot 161 is the main shot. Auxiliary shots 162, 163, 164 and 165 are completely overlapped by shot 161. The auxiliary shots, which use a significantly lower dosage than the main shot, help reduce rounding of the corners in the pattern on the surface which may otherwise occur due to limitations of the particle beam exposure system.

The aforementioned techniques for overlapping VSB shots, including ghost shots, multi-pass writing, and auxiliary shots, have two common characteristics:
 The union of either all the shots or some subset of the shots, possibly oversized or undersized, matches the target pattern.
 All of the techniques increase the shot count compared to single-pass non-overlapping VSB shots.

The current disclosure presents a method for generating patterns which avoids these two characteristics. In this method:
 Shot overlap is allowed.
 There is in general no subset of shots which, when unioned together, matches the target pattern, even when any of the shots are oversized.
 The shot count may be less, often substantially less, than the shot count for single-pass, non-overlapping VSB.

The method of the present disclosure achieves these goals by determining, using for example computer-based optimization techniques, a set of possibly-overlapping VSB shots which are calculated to form the desired pattern on the surface. Specifically, the conventional constraint of providing a normal dose to the resist in all parts of the pattern is eliminated. The use of other-than-normal resist dosage, both in non-overlapping and overlapping VSB shots, allows creation of patterns with fewer shots than with conventional techniques. The optimization technique depends on an accurate method, such as particle beam simulation, to calculate the pattern which will be registered in the resist from the other-than-normal dosages. The computational complexity involved in the particle beam simulation and shot optimization is high, however, when applied to a full design. The complexity of the computations have heretofore pushed people into using uniform normal dosage, where particle beam simulation of the entire design is not required.

The various flows described in this disclosure may be implemented using general-purpose computers with appropriate computer software. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. The optimization and simulation processes described in this disclosure may include iterative processes of revising and recalculating possible solutions.

Figure 9A:
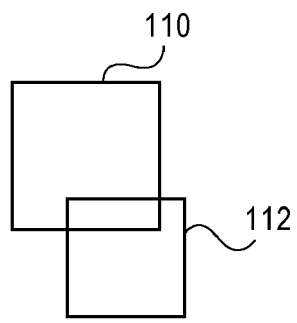
FIG. 9A illustrates two overlapping VSB shots.
Figure 9B:
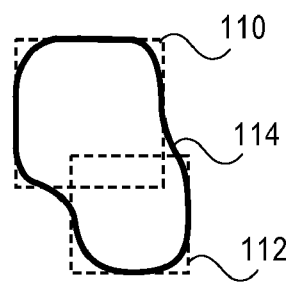
FIG. 9B illustrates a pattern on the surface resulting from the overlapping VSB shots of FIG. 9A using a normal dose.
Figure 9C:
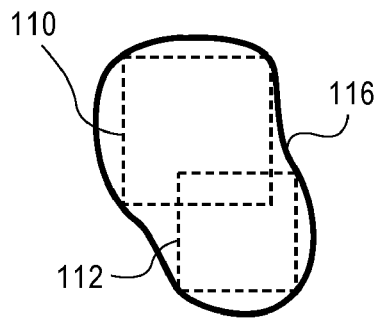
FIG. 9C illustrates a pattern on the surface resulting from the overlapping VSB shots of FIG. 9A using higher than normal dose.

The shot count reduction of the current disclosure compared with conventional techniques may be particularly significant for curvilinear patterns. For example, FIG. 9A illustrates two rectangular overlapping shots 110 and 112. FIG. 9B illustrates a pattern 114 that may be generated on the surface from normal dose shots 110 and 112, which are shown as dotted lines in FIG. 9B. The pattern 114 would require more than two shots if non-overlapping shots were used. In another example, FIG. 9C illustrates a pattern 116 that may be generated by shots 110 and 112 with each shot having a higher than normal dose. Overall, the pattern 116 is larger than pattern 114 and is somewhat differently shaped. Varying the dose of one or more of the overlapping shots comprising a pattern may be used to enhance the number of patterns can be made available using only a small number of shots. Particle beam exposure simulation may be used to determine the pattern which will be formed on a surface from a plurality of shots, such as the patterns of FIG. 9B and FIG. 9C. Patterns which are known to be generated by a single VSB shot or combinations of VSB shots are called glyphs. A library of glyphs may be pre-computed and made available to optical proximity correction or mask data preparation functions. For example, the patterns 116 and 114 can be pre-computed and stored in a glyph library.

Figure 18A:
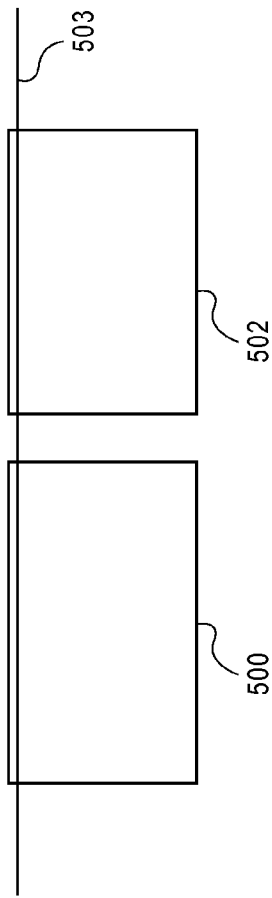
FIG. 18A illustrates two VSB shots in close proximity to each other.
Figure 18B:
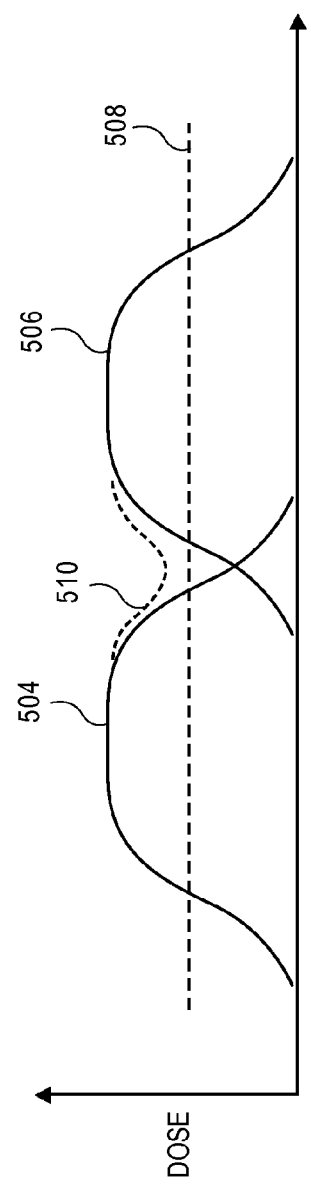
FIG. 18B illustrates a graph of the dose along a line drawn through the shapes of FIG. 18A.
Figure 18C:
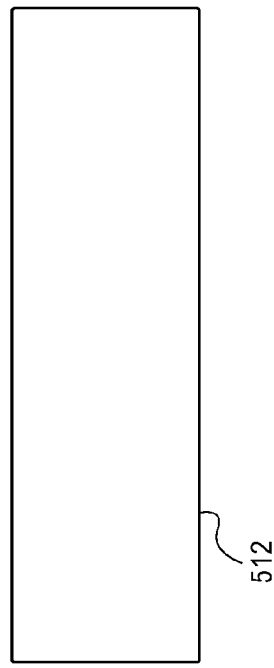
FIG. 18C illustrates the resultant pattern on the surface from the shots of FIG. 18A.

One complexity of using overlapping shots is calculating resist response for each part of the pattern. When an area of the resist receives doses from multiple shots, the doses from each of the shots must be combined to determine the total dose. For example, FIG. 18A illustrates two VSB shot patterns 500 and 502 in close proximity. FIG. 18B illustrates the dose received along the line 503 which intersects patterns 500 and 502. In FIG. 18B the dosage registered on the resist from the VSB shot for pattern 500 is 504, and the dosage registered on the resist from the VSB shot for pattern 502 is 506. Dashed line 508 shows the threshold 508 above which the resist will register the pattern. Dotted line 510 illustrates the combination of 504 and 506 in the area where both 504 and 506 are significant. It should be noted that the combined dose 510 does not go below the resist threshold 508 at any point between the patterns 500 and 502. The combination dose curve 510 therefore shows that the resist will register patterns 500 and 502 as a single combined pattern 512, as illustrated in FIG. 18C.

It is significantly more challenging to predict a resulting pattern on the surface when areas on the resist receive significantly more or less than a normal dose. Particle beam exposure simulation may be used to determine the resulting pattern. This process simulates the exposure of the resist-coated surface by the charged particle beam system, accounting for the physical characteristics of the charged particle beam system and the electro-optical and chemical characteristics of the resist and the surface underlying the resist. Particle beam exposure simulation may be used to model various non-ideal effects of the charged particle beam exposure process, including forward scattering, backward scattering, resist diffusion, coulomb effect, etching, fogging, loading and resist charging. Most of these effects are shorter-range effects, meaning that each VSB shot will affect only other nearby parts of the pattern. Back scattering, fogging and loading, however, are longer-range effects, and cannot be accurately simulated when only small parts of a pattern are considered. Resist charging, although a short-range effect, must be calculated after the final shot exposure sequence is known.

Figure 20:
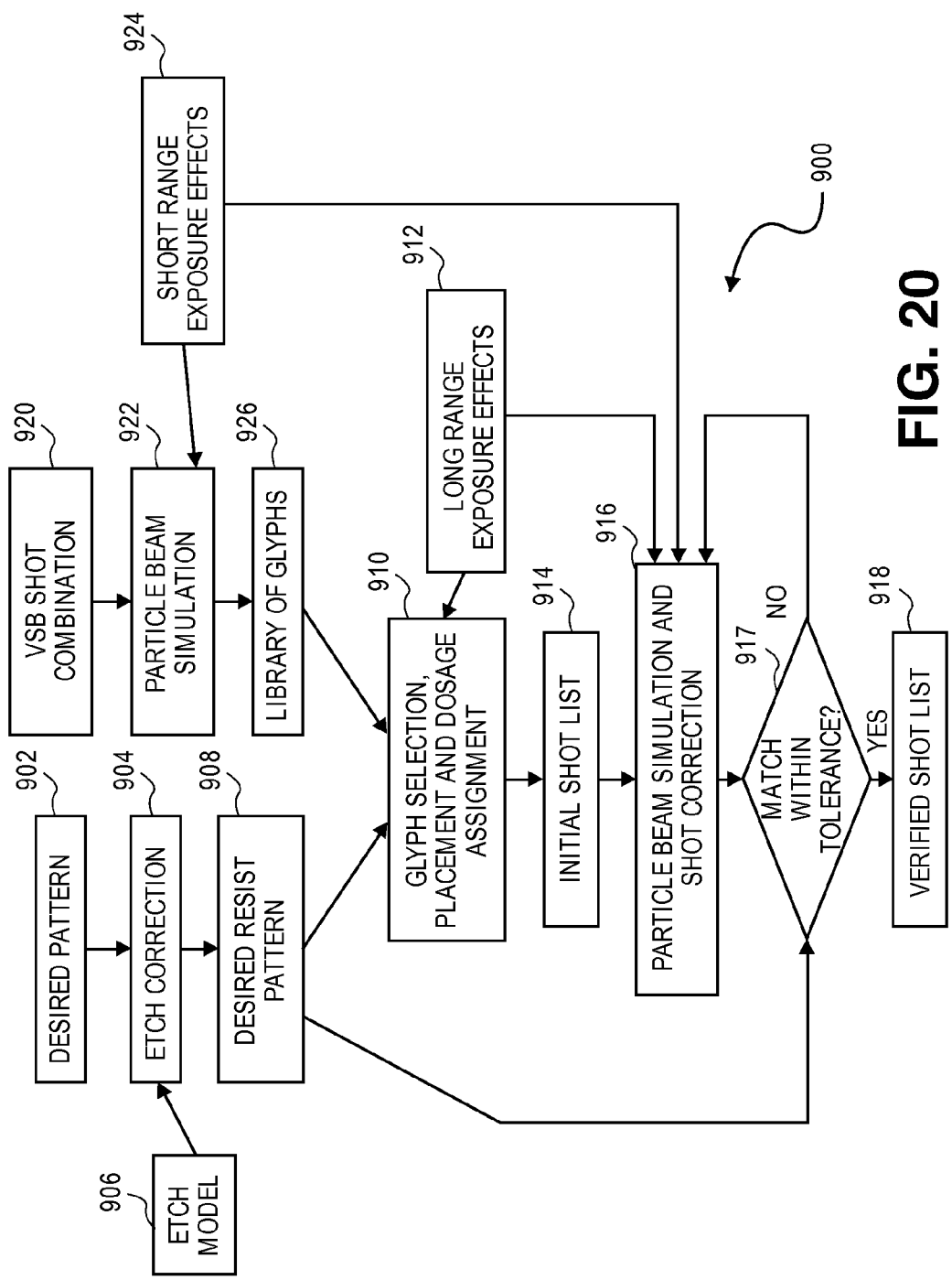
FIG. 20 illustrates an embodiment of a VSB shot fracturing conceptual flow diagram.

For example, FIG. 20 illustrates one embodiment of a flow for generating VSB shots for a pattern, a process called fracturing, by pre-calculating glyphs. In the FIG. 20 flow 900, the desired pattern 902 is the pattern that is to be formed on the surface, and is the primary input to the process. Etch correction may be calculated in step 904, based on an etch model 906. Step 904 creates a desired resist pattern 908—that is the desired pattern to be formed on the resist before etching. Desired resist pattern 908 is therefore the target pattern for matching by glyphs. Separately, a combination of VSB shots 920 may be simulated in step 922 to create a glyph to add to the library of glyphs 926. The particle beam simulation step 922 uses models for one or more of the short-range exposure effects 924. The resulting glyphs in glyph library 926 are therefore pre-compensated for the short-range exposure effects. Long range exposure effects cannot be compensated for during glyph generation, because the range of the effects may be larger than the glyph pattern. In step 910 glyphs from the glyph library are selected, placed, and dosages assigned so as to create a pattern on the resist which matches the etch-corrected desired pattern 908 within a predetermined tolerance. Step 910 uses one or more of the long-range exposure effects 912 in determining shot dosage. The output of step 910 is an initial list of VSB shots 914. The initial set of VSB shots 914 may then be simulated in step 916 and further corrected or revised. In step 917 the simulated pattern from step 916 is compared with the desired resist pattern 908 to determine if the two patterns match within the predetermined tolerance. If a match within the predetermined tolerance is not found, additional correction and simulation may be done in step 916 until the particle beam simulated pattern from step 916 is within the predetermined tolerance of the etch-corrected desired pattern 908. The tolerance used in step 917 may also be adjusted if no match within the predetermined tolerance can be achieved. The result of step 917 is a verified shot list 918 which is suitable for writing to the resist-coated surface using a charged particle beam system.

FIGS. 10A-E illustrate an example of how use of overlapping shots with varying doses can reduce shot count. FIG. 10A illustrates an ideal pattern 118, such as a contact, that may be generated by an electronic design-automation software system, to be used with optical lithography in forming a pattern on a substrate. The pattern 118 is in the shape of a square. FIG. 10B illustrates a curvilinear pattern 120 that may be created by OPC processing of pattern 118. Pattern 120 is to be formed on a reticle for use in making a mask for use an optical lithographic process. FIG. 10C illustrates one set 122 of non-overlapping rectangles which may be used to write pattern 120 on the reticle using VSB technology. As can be seen, the union of the set of rectangles 120 closely approximates the shape 120. However, some charged particle beam systems are relatively inaccurate when shots with high length-to-width aspect ratios, called slivers, are shot. The set of rectangles 120 is therefore not conventionally created by fracturing software. FIG. 10D illustrates another set of non-overlapping shapes—rectangles and triangles—that may be conventionally used to write shape 120 to a surface. This set of shapes can be shot using VSB technology without use of slivers. There are 7 shots in shot group 124. This is a large number of shots for a figure as simple as shape 120. FIG. 10E illustrates a three-shot group 130 of the present disclosure that can, with proper dosages, register a pattern on the reticle which is close to the desired pattern 120. In this example, shots 132 and 134 have a relative dose of 1.0, and shot 136 has a relative dose of 0.6. The pattern registered on the resist is the shape 140, which is equivalent to the desired shape 120, within a pre-determined tolerance. The 3-shot group 130 can register a pattern on the resist that is closer to the desired pattern 120 than is the 7-shot group 124. This example shows how overlapping shots with varying dosages may be effectively used to reduce shot count. Patterns may be formed which are substantially different than a pattern which would be formed by a simple union of shots. Furthermore, curvilinear shapes can be formed, even with shots which are parallel to the axes of the Cartesian plane. The shot group 130 may be pre-computed and made available as a glyph for use with all contacts matching the contact pattern 118.

Figure 19A:
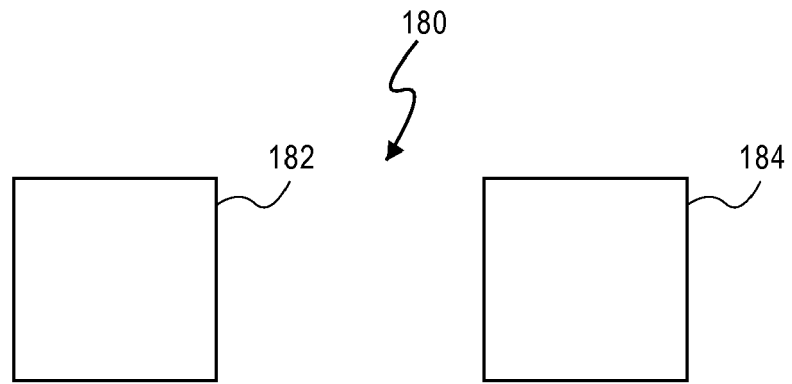
FIG. 19A illustrates a pattern to be formed on a surface.
Figure 19B:
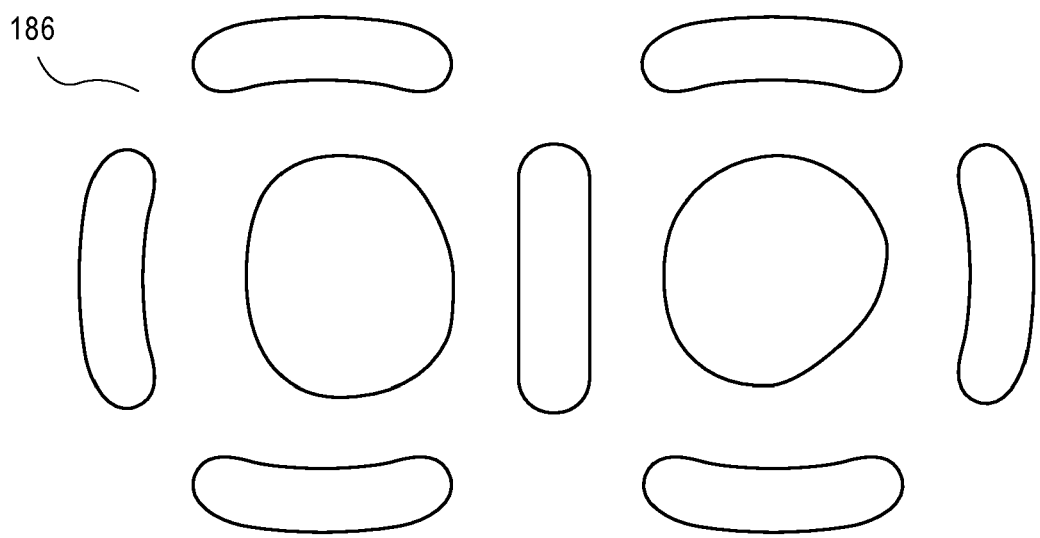
FIG. 19B illustrates a curvilinear pattern which is the result of OPC processing on the pattern of FIG. 19A.
Figure 19C:
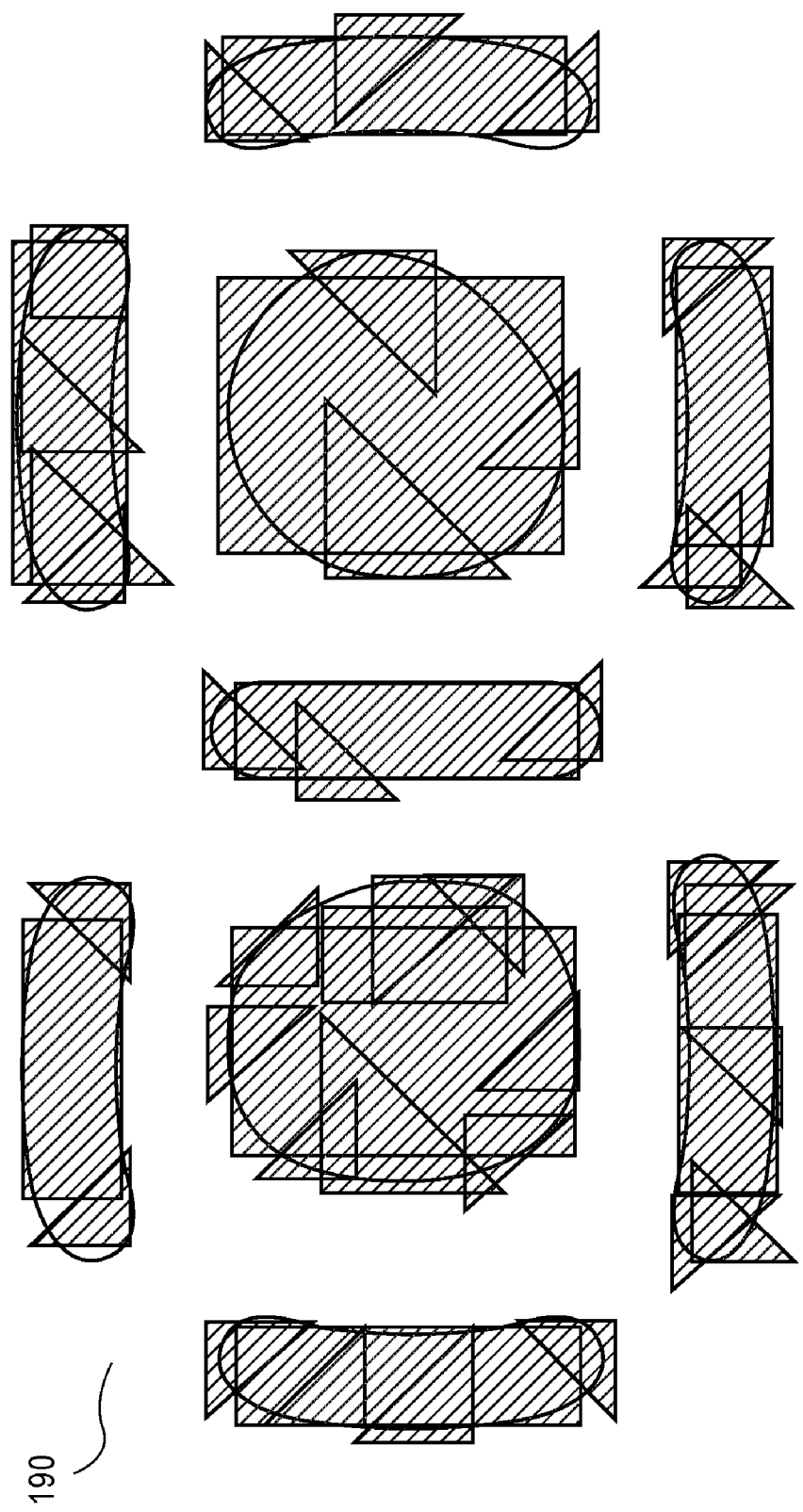
FIG. 19C illustrates an exemplary set of overlapping VSB shots which can form the curvilinear pattern of FIG. 19B on the surface.
Figure 19D:
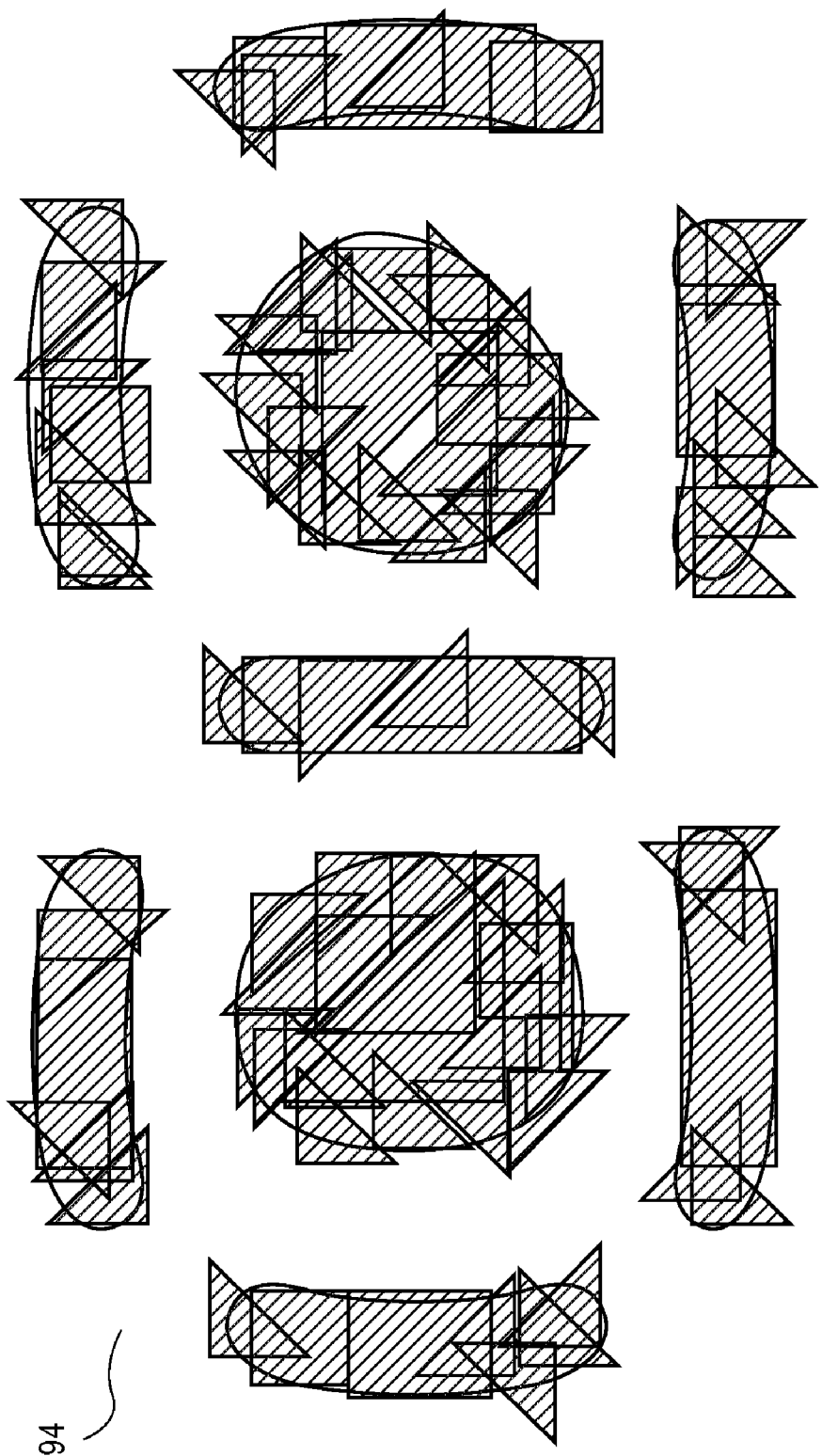
FIG. 19D illustrates another exemplary set of overlapping VSB shots which can form the curvilinear pattern of FIG. 19B on the surface.

FIGS. 19A-C illustrate overlapping VSB shots with a more complex pattern. In FIG. 19A, pattern 180 consists of two square shapes 182 and 184 that, for example, may be generated by a computer-aided design software system, for use in an optical lithographic process. FIG. 19B illustrates a corresponding pattern 186 that may be produced by OPC processing of pattern 180. This example shows that OPC processing of two identical shapes 182 and 184 can produce sets of resultant shapes that are slightly different. A large number of conventional non-overlapping VSB shots would be required to form pattern 186 on a reticle. FIG. 19C illustrates a set of overlapping variable dosage VSB shots 190 that can generate the curvilinear pattern 186 on a reticle. The shots in the set of VSB shots 190 have varying dosages, although the dosages are not illustrated. In determining this set of shots, a minimum shot size and maximum shot aspect ratio have been set as constraints. Note that the union of the shots in 190—the total area covered by the combination 190 of shots—does not match the curvilinear pattern 186. Nor does any subset of the set of VSB shots 190 match curvilinear pattern 186. Nevertheless, the calculated pattern that the resist will register does match the curvilinear pattern 186 within a predetermined tolerance. FIG. 19D illustrates another set of overlapping variable dosage VSB shots 194 that can generate the curvilinear pattern 186 on a reticle. As with FIG. 19C, the shots in the set of VSB shots 194 have varying dosages. The locations of the shots in the set of shots 190 and the set of shots 194 are quite different, yet both sets form the pattern 186 within the predetermined tolerance. This example shows how relatively efficiently curvilinear patterns may be produced on the surface with the present disclosure.

Figure 11A:
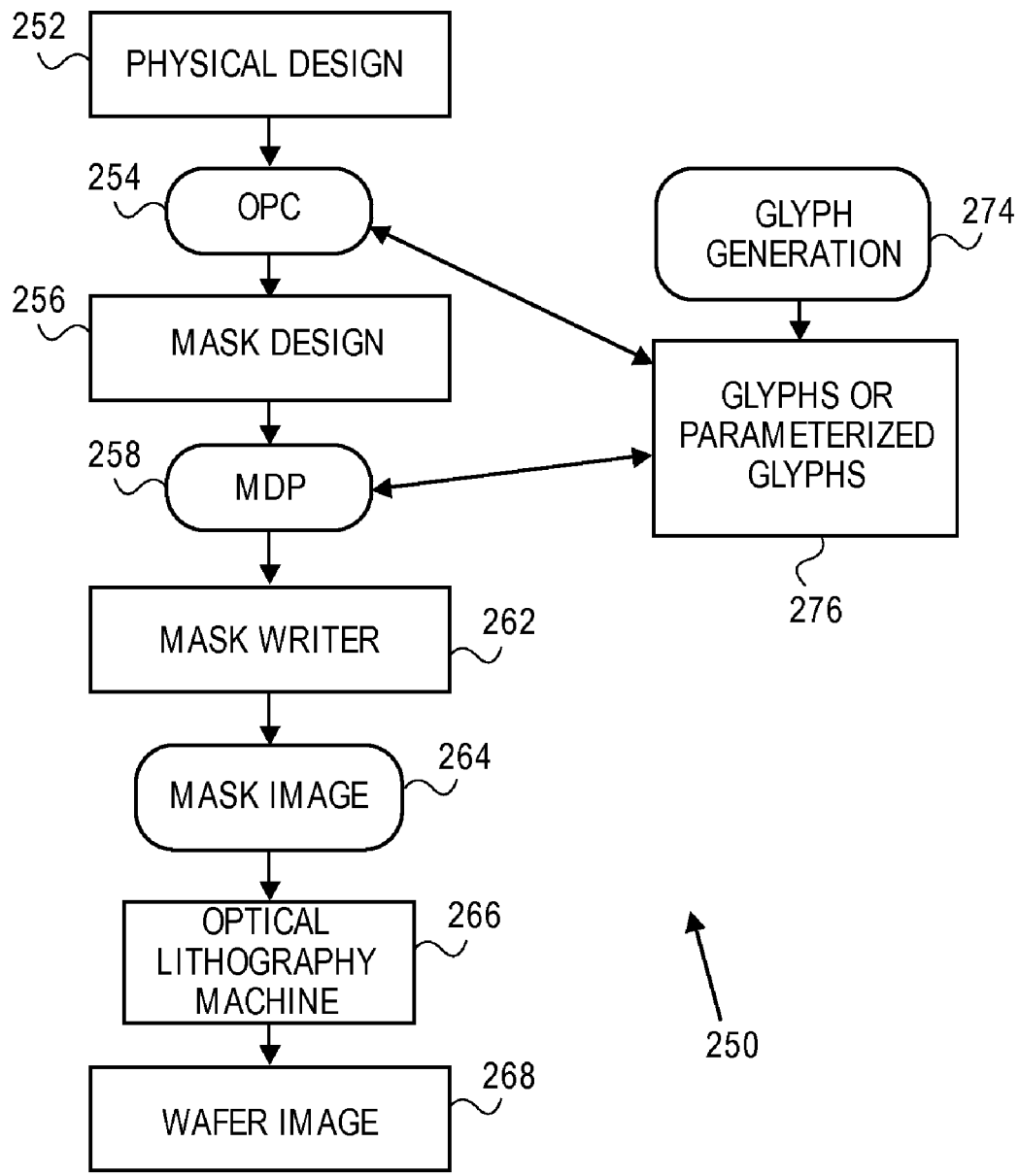
FIG. 11A illustrates an embodiment of a conceptual flow diagram of how to prepare a surface for use in fabricating a substrate such as an integrated circuit on a silicon wafer.

FIG. 11A is a conceptual flow diagram 250 of an embodiment of the present disclosure for preparing a surface for use in fabricating a substrate such as an integrated circuit on a silicon wafer using optical lithography. In a first step 252, a physical design, such as a physical design of an integrated circuit is designed. This can include determining the logic gates, transistors, metal layers, and other items that are required to be found in a physical design such as that in an integrated circuit. Next, in a step 254, optical proximity correction is determined. In an embodiment of this disclosure this can include taking as input a library of pre-calculated glyphs or parameterized glyphs, which advantageously may reduce the computing time for performing OPC. In an embodiment of this disclosure, an OPC step 254 may also include simultaneous optimization of shot count or write times, and may also include a fracturing operation, a shot placement operation allowing overlapping shots, a dose assignment operation allowing other-than-normal dosages, or may also include a shot sequence optimization operation, or other mask data preparation operations. The OPC step 254 may also use particle beam simulation. Once optical proximity correction is completed, a mask design is developed in a step 256. Then, in a step 258, a mask data preparation operation which may include a fracturing operation, a shot placement operation, a dose assignment operation, or a shot sequence optimization may take place. Either of the steps of the OPC step 254 or of the MDP step 258, or a separate program independent of these two steps 254 or 258 can include a program for determining a large number of glyphs or parameterized glyphs that can be shot on the surface to write all or a large part of the required patterns on a reticle. Combining OPC and any or all of the various operations of mask data preparation in one step is contemplated in this disclosure. Mask data preparation (MDP) step 258 may include a fracturing operation in which shot overlap and other-than-normal dosage assignment is allowed, and may also include particle beam simulation. MDP step 258 may also comprise a pattern matching operation to match glyphs to create a mask that matches closely to the mask design. Mask data preparation may also comprise inputting patterns to be formed on a surface with some of the patterns being slightly different, and using particle beam exposure simulation to calculate variation in shot dose or variation in shot overlap to reduce the shot count or total write time. A set of slightly different patterns on the surface may be designed to produce substantially the same pattern on a substrate. Once the mask data preparation is completed, the surface is generated in a mask writer machine, such as an electron beam writer system. This particular step is identified as a step 262. The electron beam writer system projects a beam of electrons through apertures in a stencil mask onto a surface to form patterns on the surface, as shown in a step 264. The completed surface may then be used in an optical lithography machine, which is shown in a step 266. Finally, in a step 268, a substrate such as a silicon wafer is produced. The glyph generation step 274 provides information to a set of glyphs or parameterized glyphs in step 276. As has been previously described, the glyph generation step 274 may use particle beam simulation. Also, as has been discussed, the glyphs or parameterized glyphs step 276 provides information to the OPC step 254 or the MDP step 258.

Figure 11B:
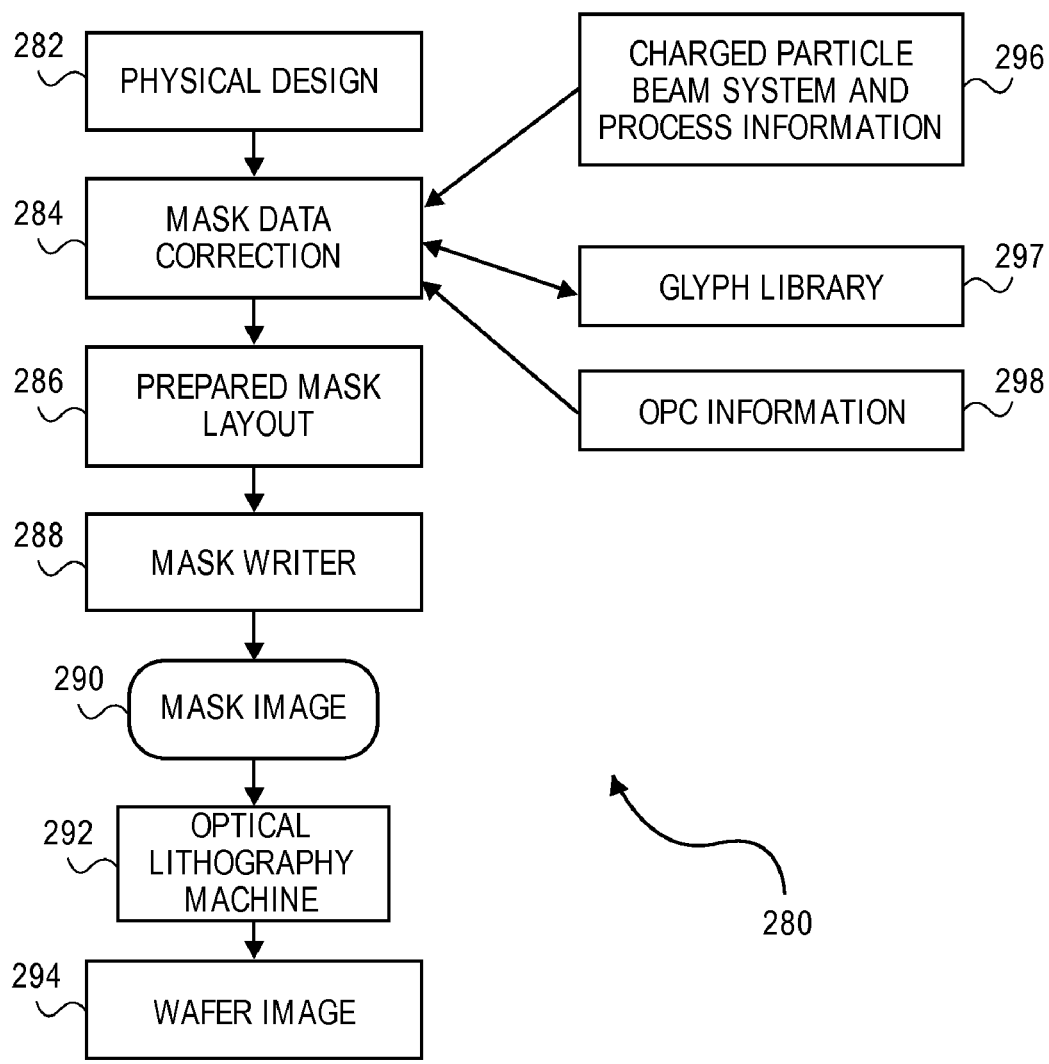
FIG. 11B illustrates another embodiment of a conceptual flow diagram of how to prepare a surface for use in fabricating a substrate such as an integrated circuit on a silicon wafer.

FIG. 11B is a more detailed flow diagram 280 of how to prepare a surface for use in fabricating a substrate such as an integrated circuit on a silicon wafer, in which OPC and MDP operations are beneficially combined in a single step. In a first step 282, a physical design, such as a physical design of an integrated circuit is obtained. The physical design may be an integrated circuit design obtained directly from conventional CAD physical design software, or it may be created from the integrated circuit design by performing, for example, Boolean operations, sizing, biasing, or retargeting of one or multiple design layers. Next, in step 284, OPC and MDP operations are performed in a single step named Mask Data Correction (MDC). Information 296 regarding the characteristics of the charged particle beam writer system and the mask manufacturing process are supplied to the MDC step. The information 296 may include, for instance, forward scattering, back scattering, resist diffusion, coulomb effect, resist charging, fogging, maximum shot size, maximum shot aspect ratio and shot geometrical descriptions. The information 296 may also include a library of possible VSB shots. In another embodiment a library of pre-computed or pre-calculated glyphs 297 may also be supplied to the MDC step. Information 298 required to perform OPC is also supplied to the MDC step 284. The MDC step 284 uses the available information 296 regarding the charged particle beam system and the process when performing optical proximity effect correction 298. The MDC step 284 optimizes the generated set of VSB shots in order to achieve a desired wafer image 294. The desired wafer image, that is the target of the MDC step, may be the physical design 282 or may be derived from the physical design 282. The optimization may include the choice of the VSB shots, their locations, and their doses. The choice of the VSB shots, their locations, and their doses may be based on the charged particle beam system information 296, on a database of VSB shots, on a library of glyphs, or a combination thereof. The optimization of the fractured data may include the simulation of the mask image, a simulation of the wafer image based on the simulated mask image, a comparison of the simulated wafer image and the target wafer image. The result of such comparison may be used as an optimization criteria. Other optimization criteria may also include: the number of VSB shots, the minimum size of the VSB shots (i.e. slivers), the creation of identical sets of VSB shots for identical target wafer images in the same environment, and the creation of symmetrical sets of VSB shots for writing symmetrical patterns in the physical design 282. Next, the prepared mask layout 286 which is created by the MDC step 284 is used in a mask writer system 288 to generate patterns on a surface 290. The completed surface may then be used in an optical lithography machine, which is shown in step 292. Lastly an image on a wafer is produced in step 294.

Figure 12:
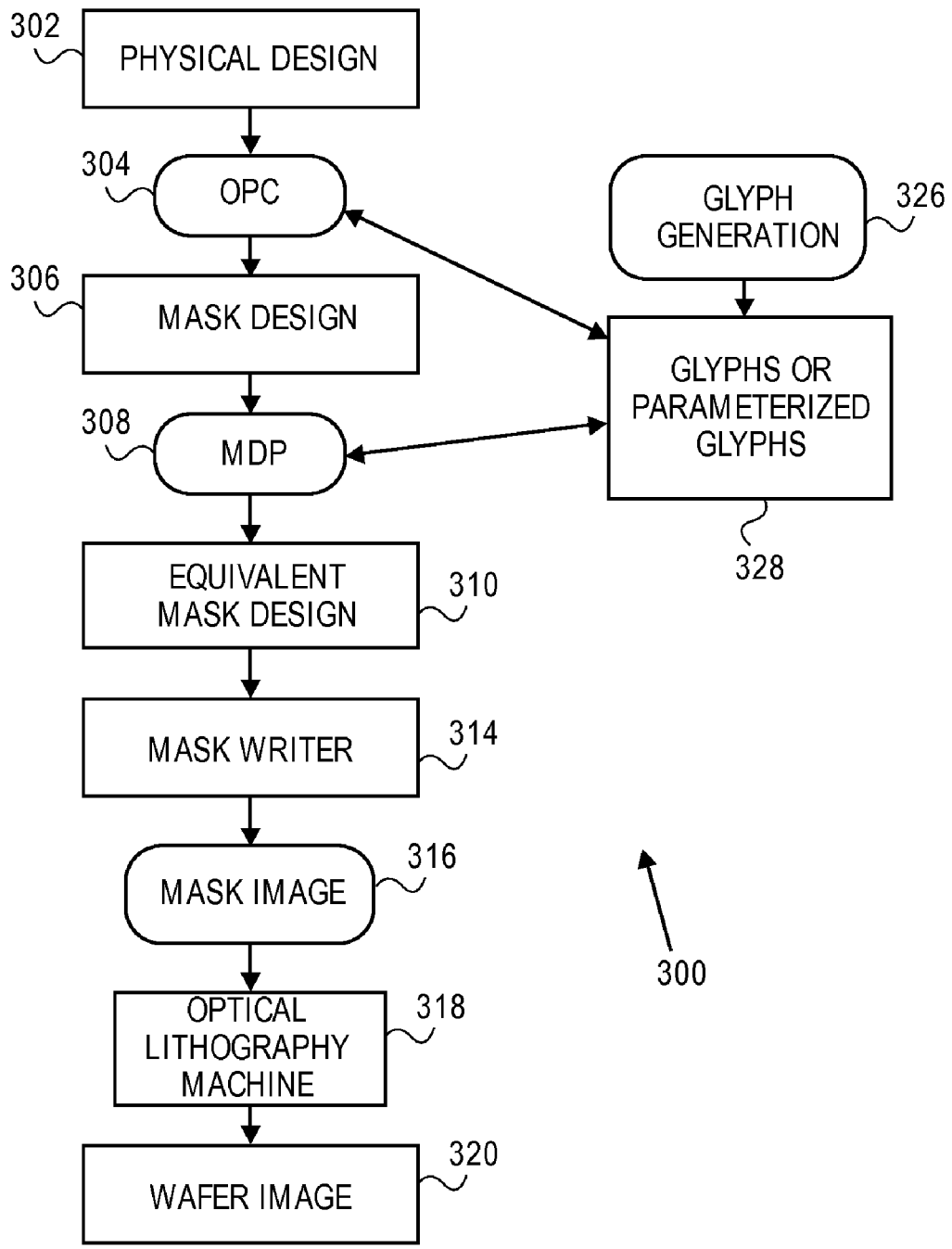
FIG. 12 illustrates yet another conceptual flow diagram of how to prepare a surface for use in fabricating a substrate such as an integrated circuit on a silicon wafer.

With reference now to FIG. 12, another conceptual flow diagram 300 of how to prepare a surface for use in fabricating a substrate such as an integrated circuit on a silicon wafer using optical lithography is shown, in which a mask design generated from mask data preparation output is compared to the post-OPC mask design based on an equivalence criteria. In a first step 302, a physical design, such as a physical design of an integrated circuit is designed. This may be the ideal pattern that the designer wants transferred onto a substrate. Next, in a step 304, optical proximity correction of the ideal pattern generated in the step 302 is determined. This can include selecting glyphs that need to be prepared. Optical proximity correction may also comprise inputting possible glyphs, the glyphs being determined using particle beam exposure simulation to calculate varying a shot dose or varying shot overlap. Further, optical proximity correction may comprise selecting a glyph from the possible glyphs, computing the transferred pattern on the substrate based on the selected glyph, and selecting another glyph if the computed pattern differs from the desired corrected pattern by greater than a predetermined threshold. Once optical proximity correction is completed a mask design is developed in a step 304. Then, in a step 306, a mask design is prepared. Once the mask design is prepared further enhancement of the mask design takes place in a mask data preparation step 308. Mask data preparation may also comprise pattern matching to match glyphs to create a mask that matches closely to the mask design. Iterations, potentially including only one iteration where a correct-by-construction "deterministic" calculation is performed, of pattern matching, dose assignment, and equivalence checking may also be performed. These steps will assist in preparing an enhanced equivalent mask design.

Once the mask is enhanced, an equivalent mask design, such as a set of VSB shots, is generated in a step 310. There are two motivations for tests that can be used to determine whether the equivalent mask design is really equivalent to the mask design. One motivation is to pass mask inspection. Another motivation is to confirm that the chip or integrated circuit will function properly once it has been fabricated. The closeness to which a pattern matching operation declares a match may be determined by a set of equivalence criteria. An equivalence criteria may be driven at least partially by litho-equivalence. Litho-equivalence may be determined by a set of predetermined geometric rules, a set of mathematical equations that declare a match, a partial match, or a no match, or by running a lithography simulation of the mask design and a lithography simulation of the equivalent mask design and by comparing the two results using a set of predetermined geometric rules, or by a set of mathematical equations that declare a match, a partial match, or no match. The MDP step 308 may use a pre-determined set of glyphs, or parameterized glyphs to optimize for shot count or write time while insuring that a resulting equivalent mask design 310 is acceptable to the equivalence criteria. In another embodiment, OPC and MDP may be combined in a correct-by-construction method, in which case there may not be the mask design 306 generated separately from the equivalent mask design 310.

Once the equivalent mask design is determined to be correct, a surface is prepared in a charged particle beam writer system, such as an electron beam writer system. This step is identified as a step 314 mask writer. The electron beam writer system projects a beam of electrons through apertures in a stencil mask onto a surface to form patterns on the surface. The surface is completed in a step 316, mask image. The completed surface may then be used in an optical lithography machine, which is shown in a step 318 to transfer the patterns found on the surface to a substrate such as a silicon wafer to manufacture an integrated circuit. Finally, in a step 320, a substrate such as a semiconductor wafer is produced. The glyph generation step 326 provides information to a set of glyphs or parameterized glyphs in step 328. As has been previously described, the glyph generation step 326 may use particle beam simulation. Also, as has been discussed, the glyphs or parameterized glyphs step 328 provides information to either the OPC step 304 or the MDP step 308.

Referring again to FIG. 11A, as discussed above, in one embodiment, the OPC step 254 may include various functions of the MDP step 258. The optical proximity correction system can start with a large library of pre-computed or pre-calculated glyphs. The optical proximity correction system can then attempt to use the available glyphs as much as possible in performing optical proximity correction transformation of the original physical design of the integrated circuit to the reticle design. Glyphs may be each marked with an associated shot count and write time optimization value or values and an optical proximity correction system, a mask data preparation system, or some independent program may optimize for shot count or write time by selecting the lower shot count or write time. This optimization may be performed in a greedy manner where each glyph is chosen to optimize what is the best glyph to choose for shot count or write time with a certain order in which to choose glyphs to match a pattern, or in an iterative optimization manner such as with simulated annealing where exchanges of glyph selection optimizes the overall shot count or write time. It is possible that some desired patterns to be formed on a reticle may still remain unmatched by any available glyphs and such patterns may need to be formed by use of individual VSB shots not part of any pre-computed glyph.

Figure 15:
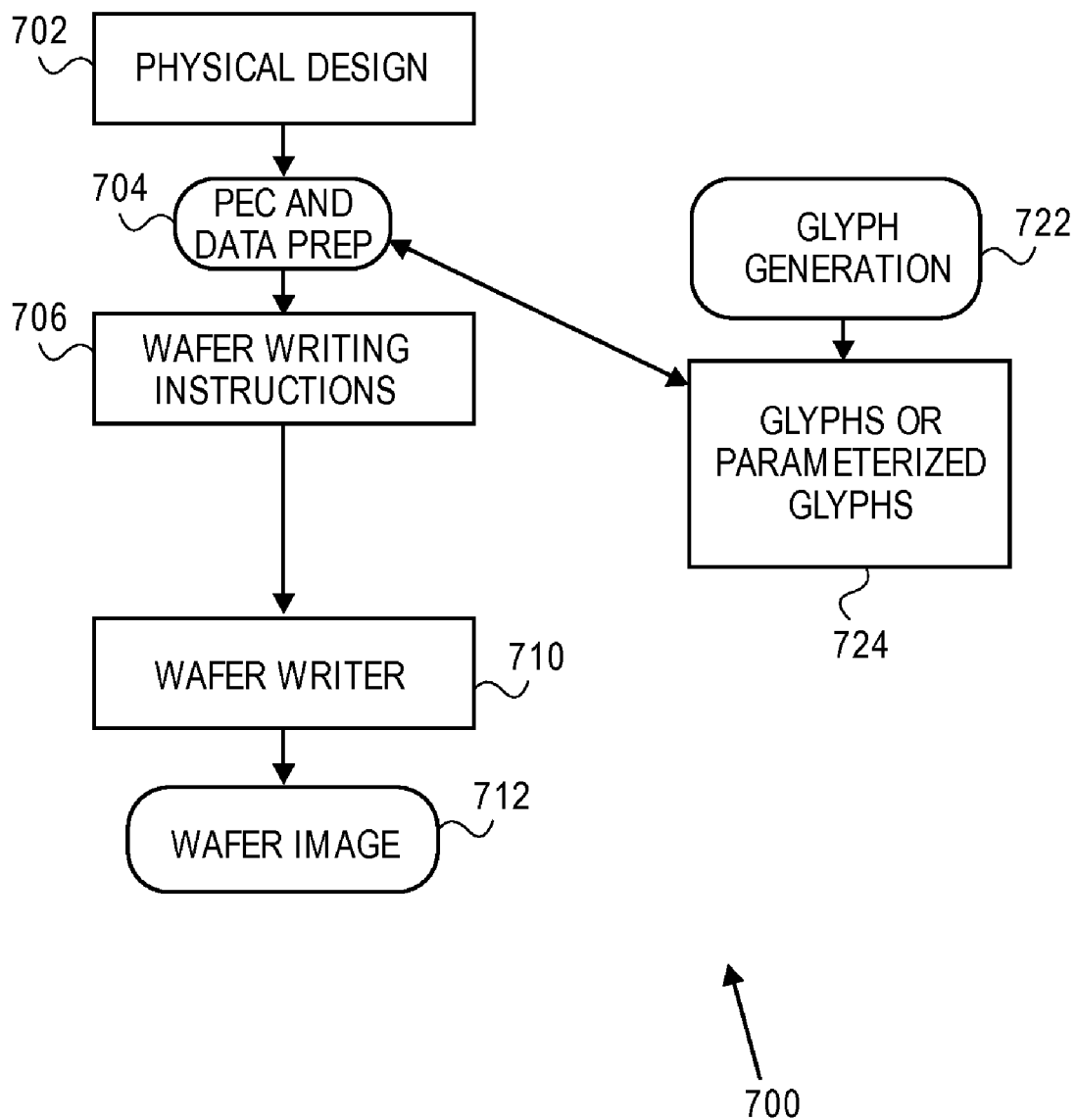
FIG. 15 illustrates a further embodiment of a conceptual flow diagram of how to prepare a surface in fabricating a substrate such as an integrated circuit on a silicon wafer.

Referring now to FIG. 15, another conceptual flow diagram 700 of how to prepare a surface which is directly written on a substrate such as a silicon wafer is shown. In a first step 702, a physical design, such as a physical design of an integrated circuit is determined. This may be an ideal pattern that the designer wants transferred onto a substrate. Next, in a step 704, proximity effect correction (PEC), and other data preparation (DP) steps are performed to prepare input data to a substrate writing device, where the result of the physical design contains a multiplicity of patterns that are slightly different. The step 704 may also comprise inputting possible glyphs or parameterized glyphs from step 724, the glyphs being based on possibly overlapping VSB shots, and the glyphs being determined using a calculation of varying a shot dose or varying a shot position in glyph generation step 722. The step 704 may also comprise pattern matching to match glyphs to create a wafer image that matches closely to the physical design created in the step 702. Iterations, potentially including only one iteration where a correct-by-construction "deterministic" calculation is performed, of pattern matching, dose assignment, and equivalence checking may also be performed. The result of step 704 is a set of wafer writing instructions 706. Wafer writing instructions 706 are then used to prepare a wafer in a wafer writer machine, such as an electron beam writer system. This step is identified as the step 710. The electron beam writer system projects a beam of electrons through an adjustable aperture onto a surface to form patterns in a surface. The surface is completed in a step 712. The glyph generation step 722 provides information to a set of glyphs or parameterized glyphs in step 724. The glyphs or parameterized glyphs step 724 provides information to the PEC and Data Prep step 704. The step 710 may include repeated application as required for each layer of processing, potentially with some processed using the methods described in association with FIGS. 11A and 12, and others processed using the methods outlined above with respect to FIG. 15, or others produced using any other wafer writing method to produce integrated circuits on the silicon wafer.

Figure 13:
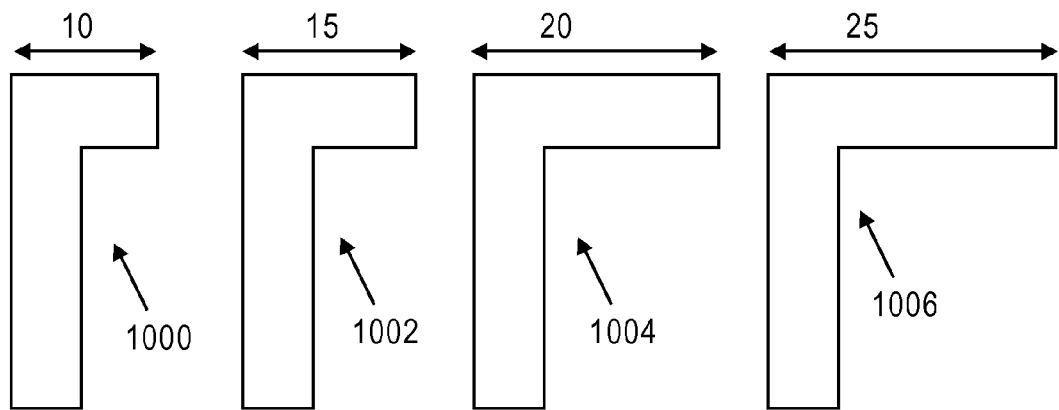
FIG. 13 illustrates examples of glyphs.

Referring now to FIG. 13, examples of glyphs 1000, 1002, 1004, and 1006 that may be used by optical proximity correction, fracturing, proximity effect correction, or any other steps of mask data preparation are shown. These glyphs 1000, 1002, 1004, and 1006 may be generated by a similarly-fractured set of VSB shots or may be generated by different fracturings. Regardless of the method of creating the glyphs, the glyphs represent possible patterns that are known to be possible patterns on the surface. Each glyph may have associated with it the position and dosage information for each of the VSB shots comprising the glyph.

Figure 14:
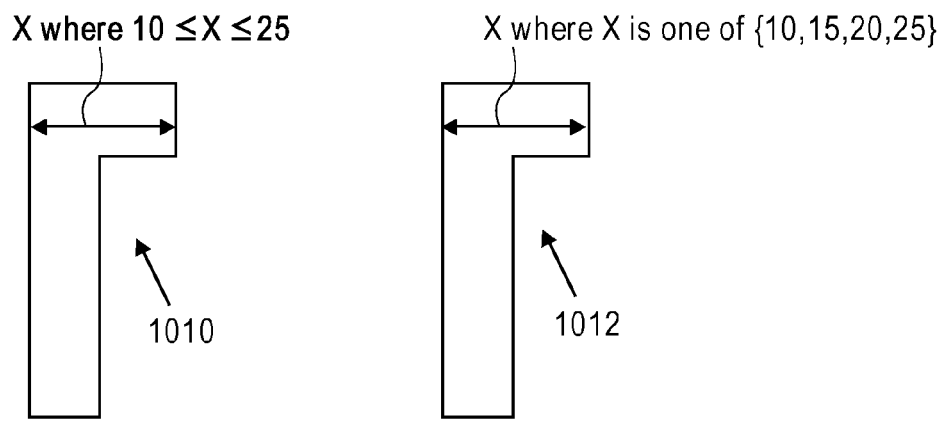
FIG. 14 illustrates examples of parameterized glyphs.

FIG. 14 shows examples of parameterized glyphs 1010 and 1012. The glyph 1010 demonstrates a general shape described with a specification of a dimension that can be varied, in this case the length X being varied from length unit values between 10 and 25. The glyph 1012 demonstrates the same general shape in a more restrictive way where the length X can only be one of the specific values, for example, 10, 15, 20, or 25. The parameterized glyph 1010 demonstrates that these descriptions allow for a large variety of possible glyphs that is not practical with the enumeration method of glyphs that are not parameterized.

An example of a parameterized glyph description for the glyph 1010 may be as follows:

--- pglyph upsideDownLShape (x : nanometers where ((x = 10) or ((x > 10) and (x < 25)) or (x = 25)));
rect (0, 0, 5, 15);
rect (0, 15, x, 20);
end pglyph;

---

An example of a parameterized glyph description for the glyph 1012 may be as follows:

--- pglyph upsideDownLShape2 (x : nanometers where ((x = 10) or (x = 15) or (x = 20) or (x = 25)));
rect (0, 0, 5, 15);
rect (0, 15, x, 20);
end pglyph;

---

These example descriptions are based on parameters that yield a logical test that determines which values of parameters meet a certain criteria such as "where ((x=10) or (x=15) or (x=20) or (x=25))" or "where ((x=10) or ((x>10) and (x<25)) or (x=25))." There are many other ways to describe a parameterized glyph. Another example that demonstrates a constructive method is as follows:

```
pglyph upsideDownLShape2 (x : nanometers);
glyphFor (x = 10, x + x+5; x>25)
{
rect (0, 0, 5, 15);
rect (0, 15, x, 20);
}
end pglyph;.
```

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present system and method for manufacturing a surface or integrated circuit using variable shaped beam lithography may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A method for manufacturing a surface using charged particle beam lithography, the method comprising:
   inputting a desired pattern to be formed on the surface;
   determining a plurality of variable shaped beam (VSB) shots, wherein shots in the plurality of shots are allowed to overlap each other, and wherein the union of any subset of the plurality of VSB shots, each shot in the subset being oversized or being undersized or being the originally-determined size, is different than the desired pattern;
   calculating a calculated pattern on the surface from the plurality of VSB shots;
   revising the plurality of VSB shots and recalculating the calculated pattern if the calculated pattern differs from the desired pattern by more than a predetermined tolerance; and
   forming the pattern on the surface with the plurality of VSB shots.

2. The method of claim 1 wherein the step of calculating comprises charged particle beam simulation.

3. The method of claim 2 wherein the charged particle beam simulation includes at least one of a group consisting of forward scattering, backward scattering, resist diffusion, coulomb effect, etching, fogging, loading and resist charging.

4. The method of claim 1 wherein the desired pattern is curvilinear.

5. The method of claim 1 wherein each VSB shot comprises a dose, and wherein the doses of the VSB shots are allowed to vary with respect to each other.

6. The method of claim 1 wherein at least one of the steps of determining and revising comprises using an optimization technique to determine the plurality of VSB shots.

7. The method of claim 6 wherein the plurality of VSB shots is minimized in number.

8. The method of claim 6 wherein the plurality of VSB shots having an aspect ratio greater than a predetermined maximum is minimized in number.

9. The method of claim 1 further comprising inputting possible glyphs, each of the glyphs being determined using a calculation of at least one VSB shot, wherein the step of determining comprises selecting a glyph from the possible glyphs.

10. The method of claim 1 wherein the plurality of VSB shots is constrained to be symmetrical when the desired pattern is symmetrical.

11. The method of claim 1 wherein the surface is a reticle.

12. The method of claim 1 wherein the surface is a substrate.

13. The method of claim 1 wherein the step of determining uses a correct-by-construction deterministic technique.

14. A method for manufacturing an integrated circuit using an optical lithographic process, the optical lithographic process using a reticle, the method comprising:
   inputting a desired pattern to be formed on the reticle;
   determining a plurality of variable shaped beam (VSB) shots, wherein shots in the plurality of shots are allowed to overlap each other, and wherein the union of any subset of the plurality of VSB shots, each shot in the subset being oversized or being undersized or being the originally-determined size, is different than the desired pattern;
   calculating a calculated pattern on the reticle from the plurality of VSB shots;
   revising the plurality of VSB shots and recalculating the calculated pattern if the calculated pattern differs from the desired pattern by more than a predetermined tolerance; and
   forming the pattern on the reticle with the plurality of VSB shots.

15. The method of claim 14 wherein the step of calculating comprises charged particle beam simulation.

16. The method of claim 15 wherein the charged particle beam simulation includes at least one of a group consisting of forward scattering, backward scattering, resist diffusion, coulomb effect, etching, fogging, loading and resist charging.

17. The method of claim 14 wherein each VSB shot comprises a dose, and wherein the doses of the VSB shots are allowed to vary with respect to each other.

18. The method of claim 14 wherein at least one of the steps of determining and revising comprises using an optimization technique to determine the plurality of VSB shots.

19. The method of claim 18 wherein the plurality of VSB shots is minimized in number.

20. The method of claim 14 further comprising:
   manufacturing a mask from the reticle, the mask containing the pattern formed on the reticle; and
   transferring the pattern on the mask to a substrate using optical lithography.

21. The method of claim 20 further comprising:
   inputting an ideal pattern on the substrate; and
   calculating a simulated pattern on the substrate, wherein the step of determining comprises minimizing the difference between the ideal pattern on the substrate and the simulated pattern on the substrate.

22. The method of claim 21, wherein the simulated pattern on the substrate is calculated using the calculated pattern on the reticle.

23. A method for manufacturing an integrated circuit, the integrated circuit having a substrate, the method comprising:
   inputting a desired pattern to be formed on the substrate;
   determining a plurality of variable shaped beam (VSB) shots, wherein shots in the plurality of shots are allowed to overlap each other, and wherein the union of any subset of the plurality of VSB shots, each shot in the subset being oversized or being undersized or being the originally-determined size, is different than the desired pattern;

calculating a calculated pattern on the substrate from the plurality of VSB shots;

revising the plurality of VSB shots and recalculating the calculated pattern if the calculated pattern differs from the desired pattern by more than a predetermined tolerance; and forming the pattern on the substrate with the plurality of VSB shots.

24. The method of claim 23 wherein the step of calculating comprises charged particle beam simulation.

25. The method of claim 23 wherein at least one of the steps of determining and revising comprises using an optimization technique to determine the plurality of VSB shots.

* * * * *